United States Patent
Choi et al.

(10) Patent No.: US 11,923,698 B2
(45) Date of Patent: Mar. 5, 2024

(54) COIL FOR FOREIGN OBJECT DETECTION AND WIRELESS POWER TRANSMITTER COMPRISING THE SAME

(71) Applicant: Samsung Electronics Co., Ltd., Suwon-si (KR)

(72) Inventors: Jinsoo Choi, Suwon-si (KR); Bohwan Choi, Suwon-si (KR); Sungbum Park, Suwon-si (KR); Youngho Ryu, Suwon-si (KR); Kyungmin Lee, Suwon-si (KR); Sangwook Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 97 days.

(21) Appl. No.: 17/664,365

(22) Filed: May 20, 2022

(65) Prior Publication Data

US 2022/0376558 A1 Nov. 24, 2022

Related U.S. Application Data

(63) Continuation of application No. PCT/KR2022/005075, filed on Apr. 7, 2022.

(30) Foreign Application Priority Data

May 21, 2021 (KR) .................. 10-2021-0065821
Dec. 3, 2021 (KR) .................. 10-2021-0171943

(51) Int. Cl.
*H02J 50/60* (2016.01)
*G01R 19/10* (2006.01)
(Continued)

(52) U.S. Cl.
CPC .............. *H02J 50/60* (2016.02); *G01R 19/10* (2013.01); *G01V 3/10* (2013.01); *H02J 50/10* (2016.02)

(58) Field of Classification Search
CPC ....................................................... H02J 50/60
(Continued)

(56) References Cited

U.S. PATENT DOCUMENTS

2012/0146580 A1  6/2012  Kitamura
2014/0015329 A1  1/2014  Widmer et al.
(Continued)

FOREIGN PATENT DOCUMENTS

KR  10-2014-0066068 A  5/2014
KR  10-2016-0070709 A  6/2016
(Continued)

OTHER PUBLICATIONS

International Search Report and Written Opinion of the International Searching Authority dated Jul. 15, 2022, in connection with International Application No. PCT/KR2022/005075, 11 pages.

*Primary Examiner* — Joseph Chang

(57) ABSTRACT

A detection coil includes a first sub coil disposed on a first PCB, the first sub coil includes a first part, and a second part that is disposed under the first part and that includes: one end connected to one end of the first part and is wound in a direction opposite to a direction the first part is wound. The detection coil includes a second sub coil disposed on a second PCB and including a third part and a fourth part disposed under the third part. The fourth part includes one end connected to one end of the third part, and is wound in a direction opposite to a direction the third part is wound. The first and second parts have polygonal shapes symmetrical to each other. The third and fourth parts have polygonal shapes symmetrical to each other. The first and second sub coils are arranged to partially overlap each other.

23 Claims, 19 Drawing Sheets

(51) Int. Cl.
*G01V 3/10* (2006.01)
*H02J 50/10* (2016.01)

(58) Field of Classification Search
USPC .......................................................... 307/104
See application file for complete search history.

(56) References Cited

U.S. PATENT DOCUMENTS

| | | |
|---|---|---|
| 2016/0118806 A1 | 4/2016 | Standke et al. |
| 2016/0156390 A1 | 6/2016 | Kuroda |
| 2016/0172869 A1 | 6/2016 | Park et al. |
| 2016/0336759 A1* | 11/2016 | Yamamoto .............. H02J 50/60 |
| 2017/0310166 A1 | 10/2017 | Huang et al. |
| 2018/0090955 A1 | 3/2018 | Graham et al. |
| 2018/0241257 A1 | 8/2018 | Muratov et al. |
| 2018/0337564 A1 | 11/2018 | Verghese et al. |
| 2019/0027973 A1 | 1/2019 | Baek et al. |
| 2019/0280533 A1 | 9/2019 | Lee et al. |
| 2021/0057938 A1 | 2/2021 | Russell et al. |

FOREIGN PATENT DOCUMENTS

| | | |
|---|---|---|
| KR | 10-2019-0009639 A | 1/2019 |
| KR | 10-2019-0088690 A | 7/2019 |
| KR | 10-2019-0106079 A | 9/2019 |
| KR | 10-2019-0111375 A | 10/2019 |

\* cited by examiner (a)

(b)

(a)

(b)

COIL FOR FOREIGN OBJECT DETECTION AND WIRELESS POWER TRANSMITTER COMPRISING THE SAME

CROSS-REFERENCE TO RELATED APPLICATIONS

This application is a Bypass Continuation of International Application No. PCT/KR2022/005075, filed on Apr. 7, 2022, and claims priority to Korean Patent Application No. 10-2021-0065821, filed on May 21, 2021 and No. 10-2021-0171943, filed on Dec. 3, 2021, in the Korean Intellectual Property Office, the disclosures of which are incorporated by reference herein their entirety.

BACKGROUND

1. Field

Various embodiments of the disclosure relate to a coil for detecting a foreign object and a wireless power transmitter including the same.

2. Description of Related Art

In line with recent development of wireless charging technologies, there has been research regarding methods for charging various electronic devices by supplying power with a single charging device.

Such wireless charging technologies provide systems using wireless power transmission/reception such that, for example, an electronic device is simply placed on a charging pad, without connecting the same to a separate charging connector, thereby automatically charging the battery thereof.

Such wireless charging technologies are classified into an electromagnetic induction type which uses coils, a resonance type which uses resonance, and an RF/Micro Wave Radiation type in which electric energy is converted into microwaves, which are then transferred.

According to a power transmission method based on wireless charging, power is transmitted between a first coil of the transmitting side and a second coil of the receiving side. The transmitting side generates a magnetic field, and a current is induced or resonated in the receiving side according to a change in the magnetic field, thereby generating energy.

Wireless charging technologies using the electromagnetic induction type or magnetic resonance type have recently become widespread in connection with electronic devices such as smartphones. If a power transmitting unit (PTU) (for example, wireless charging pad) contacts a power receiving unit (PRU) (for example, smartphone) or approaches within a predetermined distance, the battery of the PRU may be charged by electromagnetic induction or electromagnetic resonance between the transmitting coil of the PTU and the receiving coil of the PRU.

Meanwhile, if a foreign object (FO) (for example, metal object (MO)) exists between a wireless PTU and a wireless PRU during wireless charging, the magnetic field generated between the wireless PTU and the wireless PRU may increase the temperature of the FO, and may pose a risk of fire in the wireless PTU and/or wireless PRU. The wireless PTU may include a coil for detecting the above-mentioned FO (hereinafter, referred to as detection coil). The wireless PTU may use the detection coil to detect whether a FO exists before wireless charging and/or during wireless charging, and may not initiate wireless power transmission and/or may stop wireless power transmission accordingly, thereby preventing a risk of fire in the wireless power system.

A detection coil for foreign object detection (FOD) described above may be disposed near (for example, above) a conductive pattern (for example, coil) for generating a magnetic field (for example, Tx field) outwards, and an induced voltage (or induced electromotive force) may be generated in the detection coil by the generated magnetic field. The wireless PTU may confirm whether the induced voltage generated in the detection coil varies, thereby detecting presence of a foreign object.

However, an unbalanced magnetic field (for example, Tx field) may be generated. For example, in connection with the wireless PTU, the current applied to the conductive pattern (for example, coil) may vary due to a factor such as variation of a system power source. As a result, an unbalanced magnetic field may be generated, and the induced voltage may vary regardless of whether a foreign object exists, thereby decreasing the accuracy of foreign object detection.

SUMMARY

Various embodiments may provide a detection coil including parts (for example, conductors) symmetric to each other so as to counterbalance an induced voltage variation resulting from an unbalanced magnetic field, and a wireless PTU including the same.

Various embodiments may provide a detection coil having a stacking structure of coils including parts (for example, conductors) symmetric to each other, and a wireless PTU including the same.

Various embodiments may provide a wireless PTU including a circuit for compensating for an induced voltage variation caused by a factor other than presence of a foreign object (for example, system power source variation).

According to various embodiments, a detection coil may include: a first sub coil disposed on at least one surface of a first PCB and comprising a first part and a second part having one end connected to one end of the first part, and wound in a direction opposite to a direction in which the first part is wound; and a second sub coil disposed on at least one surface of a second PCB other than the first PCB and comprising a third part and a fourth part having one end connected to one end of the third part, and wound in a direction opposite to a direction in which the third part is wound, wherein the first part and the second part have polygonal shapes symmetrical to each other when viewed from one direction, the third part and the fourth part have polygonal shapes symmetrical to each other when viewed from the one direction, the second part is disposed under the first part when viewed from another direction, the fourth part is disposed under the third part when viewed from the another direction, and the first sub coil and the second sub coil are arranged to partially overlap each other when viewed from the one direction.

According to various embodiments, a detection coil may include a first part having a first polygonal shape and wound in a first winding direction when viewed from one direction and a second part having one end connected to one end of the first part, the second part having a second polygonal shape different from the first polygonal shape and wound in a second winding direction opposite to the first winding direction when viewed from the one direction, wherein the second part is disposed below the first part when viewed from another direction, and the second polygonal shape has the same size as the first polygonal shape and is symmetric to the first polygonal shape with reference to one axis when viewed from the one direction.

According to various embodiments, a wireless power transmitter may include: a detection coil; a transmitting coil configured to supply wireless power to at least one wireless power receiver; and a control circuit, wherein the detection coil comprises multiple sub coils, each of the multiple sub coils comprises a first part, when viewed from one direction, having a first polygonal shape and wound in a first winding direction, and a second part having one end connected to one end of the first part, having a second polygonal shape different from the first polygonal shape, wound in a second winding direction opposite to the first winding direction, and when viewed from the other direction, disposed below the first part, the second polygonal shape has the same size as the first polygonal shape and is symmetric to the first polygonal shape with reference to one axis when viewed from the one direction, and the control circuit is configured to obtain, during the wireless power being transmitted to the outside, a value based on a first voltage value of a first channel corresponding to first sub coils connected to each other among the multiple sub coils and a second voltage value of a second channel corresponding to second sub coils connected to each other, and identify, based on the obtained value, presence of a foreign object.

According to various embodiments, a detection coil for counterbalancing an induced voltage variation caused by an unbalanced magnetic field may be used to increase the accuracy of foreign object detection.

According to various embodiments, a detection coil having a stacking structure may be used to increase the accuracy of foreign object detection.

According to various embodiments, an induced voltage variation caused by a factor other than presence of a foreign object (for example, system power source variation) may be compensated for, thereby increasing the accuracy of foreign object detection.

Various advantageous effects exhibited by the disclosure are not limited to the above-mentioned advantageous effects.

According to various embodiments, first and second detection coils including unit coils having different sizes may be vertically stacked without parallel movement or rotation such that any unnecessary detection coil area is reduced, and a difference in induced voltage between the two detection coils is reduced, thereby preventing circuit saturation.

According to various embodiments, first and second detection coils including unit coils having different sizes may be stacked such that null lines of respective detection coils do not overlap, thereby removing null regions in which induced voltage variations may not be detected.

According to various embodiments, null region removal may increase the SNR of induced voltage variation through signal amplification, and may reduce the complexity of postprocessing circuits.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1A through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1A:
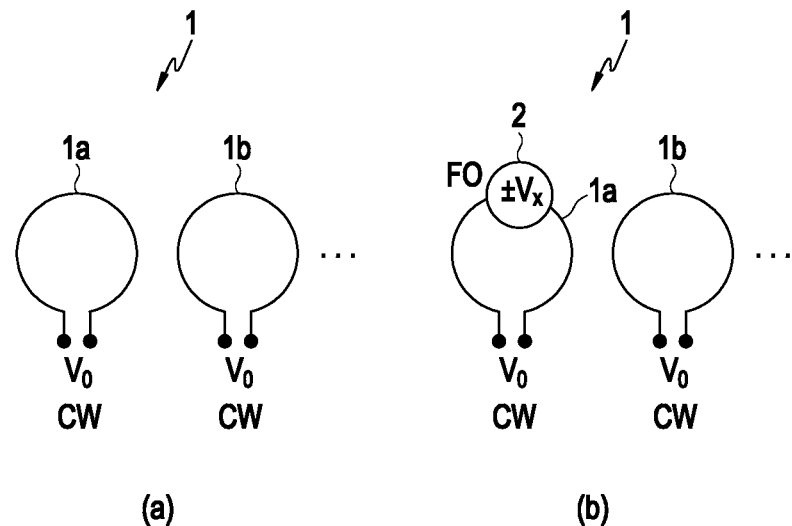
FIG. 1A illustrates an example of a detection coil according to a comparative example.

FIG. 1A illustrates an example of a detection coil 1 according to a comparative example.

Referring to (a) in FIG. 1A, the detection coil 1 may include one or more conductors 1*a* and 1*b* wound in one winding direction. The one or more conductors 1*a* and 1*b* may form sub coils, respectively. For example, the detection coil 1 may include a first conductor 1*a* and a second conductor 1*b* wound in the same winding direction (for example, a clockwise (CW) direction). The detection coil 1 may be disposed on, for example, on a transmission pad of an electronic device for wirelessly transmitting power (for example, a wireless power transmitter) and may disposed above (or different position) a conductive pattern (for example, coil) generating a magnetic field (for example, a Tx field) outward. For another example, the detection coil 1 may be included in various electronic devices, other than a wireless power transmitter, for detecting foreign objects (FO) (for example, a metal object). When a magnetic field (for example, a Tx field) is generated by a conductive pattern (for example, a coil), an induced voltage (for example, induced electromotive force) caused by the generated magnetic field may be generated on the detection coil 1 positioned above the conductive pattern (for example, a coil). For example, on the assumption that the magnetic field (for example, a Tx field) is uniform, the induced voltage having a magnitude of V0 may be respectively generated on the first sub coil (for example, the first conductor 1*a*) and the second sub coil (for example the second conductor 1*b*) wound in the same winding direction (for example, CW).

Referring to (b) in FIG. 1A, when a foreign object 2 is disposed near the first sub coil (for example, the first conductor 1*a*) of the detection coil 1, the induced voltage of the first sub coil (for example, the first conductor 1*a*) may be fluctuated due to the foreign object 2. For example, the disposition of the foreign object 2 may cause an induced voltage fluctuation ±Vx having a magnitude of Vx on the induced voltage of the first sub coil (for example, the first conductor 1*a*). The electronic device (for example, a wireless power transmitter) including the detection coil 1 may detect that an induced voltage fluctuation ±Vx has been generated and/or detect that the generated induced voltage fluctuation ±Vx is within a predetermined range (for example, greater than or equal to a predetermined magnitude) to detect the presence or location of the foreign object which may be affected by the magnetic field while wirelessly transmitting power through a conductive pattern (for example, a coil) by being disposed around the detection coil 1. When the detection coil 1 includes N sub coils, a signal to noise ratio (SNR) may be obtained through Equation 1.

$$SNR = \frac{V_x}{NV_o} \qquad \text{Equation 1}$$

Figure 1B:
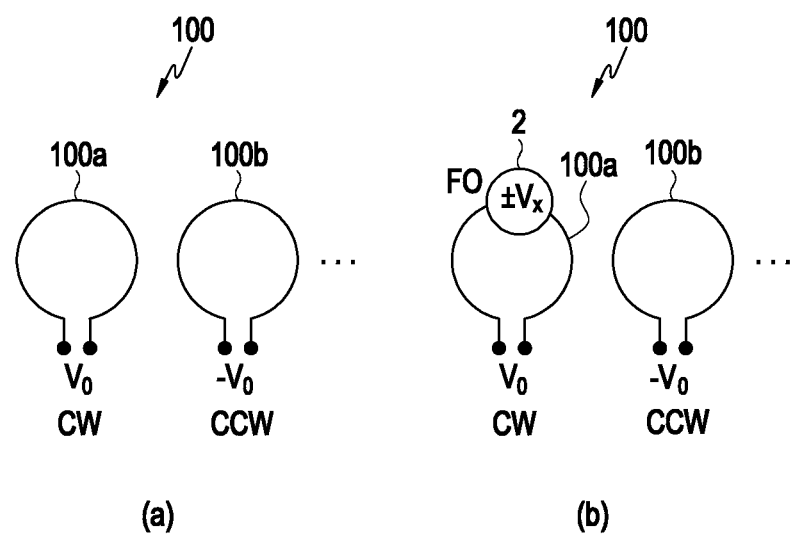
FIG. 1B illustrates an example of a detection coil according to various embodiments.

FIG. 1B illustrates an example of a detection coil 100 according to various embodiments.

Referring to (a) in FIG. 1B, the detection coil 100 may include one or more conductors 100*a* and 100*b* wound in different directions. According to various embodiments, the one or more conductors 100*a* and 100*b* may respectively form sub coils. For example, the first conductor 100*a* wound in a clockwise direction (CW) may form a first sub soil and the second conductor 100*b* wound in a counterclockwise direction (CCW) may for a second sub coil. (a) in FIG. 1A illustrates one first sub coil (for example, the first conductor 100*a* wound in the clockwise direction (CW)) and one second sub coil (for example, the second conductor 100*b* wound in the counterclockwise direction (CCW)), but two or more conductors wound in the clockwise direction (CW) or the counterclockwise direction (CCW) may be included. According to various embodiments, the detection coil 100 may be included in, for example, a transmission pad of an electronic device for wirelessly transmitting power (for example, a wireless power transmitter) and may disposed above a conductive pattern (for example, a coil) and/or ferrite (for example, spoke-type ferrite) generating a magnetic field (for example, a Tx field) outward. For another example, the detection coil 100 may be included in various electronic devices, other than a wireless power transmitter, for detecting foreign objects (for example, a metal object). When a magnetic field (for example, a Tx field) is generated by a conductive pattern (for example, a coil), an induced voltage caused by the generated magnetic field may be generated on the detection coil 100 positioned above the conductive pattern (for example, a coil). For example, on the assumption that the magnetic field (for example, a Tx field) is uniform, the induced voltage having opposite magnitudes (for example, +V0 or −V0) may be respectively generated on the first sub coil (for example, the first conductor 100*a*) and the second sub coil (for example the second conductor 100*b*) wound in winding directions different from each other. According to various embodiments, the conductors (for example, the first conductor 100*a* and the second conductor 100b) wound in different winding directions) may be connected to each other in series so as to form a first part and a second part of one sub coil. In this case, on the assumption that the magnetic field is uniform, the induced voltages generated in each part may be offset. When the magnetic field (for example, a Tx field) is not uniform, at least a portion of the induced voltage generated on each of parts wound in different winding directions (for example, a part corresponding to the first conductor 100a and a part corresponding to the second conductor 100b) of the sub coil connected in series may not be offset and an unoffset amount having a magnitude of Vdis may be generated.

Referring to (b) in FIG. 1B, when a foreign object 2 is disposed near the first part (for example, the first conductor 100a) of the detection coil 100, the induced voltage of the first part (for example, the first conductor 100a) may be fluctuated due to the foreign object 2. For example, the disposition of the foreign object 2 may cause an induced voltage fluctuation ±Vx having a magnitude of Vx on the induced voltage of the first part (for example, the first conductor 100a). The electronic device (for example, a wireless power transmitter) including the detection coil 100 may detect that an induced voltage fluctuation ±Vx has been generated and/or detect that the generated induced voltage fluctuation ±Vx is within a predetermined range (for example, greater than or equal to a predetermined magnitude) to detect the presence or location of the foreign object which may be affected by the magnetic field while wirelessly transmitting power through a conductive pattern (for example, a coil) by being disposed around the detection coil 100. In this case, a signal to noise ratio (SNR) may be obtained through Equation 2.

$$SNR = \frac{V_x}{V_{dis}}$$ Equation 2

Vdis of Equation 2 may represent an unoffset amount of each induced voltage of parts wound in different directions (for example, a part corresponding to the first conductor 100a and a part corresponding to the second conductor 100b) of the sub coil connected in series when the magnetic field (for example, a Tx field) is not uniform. The unoffset amount Vdis may be a value smaller than a magnitude V0 of the induced voltage generated on each part (for example, a part corresponding to the first conductor 100a and a part corresponding to the second conductor 100b). In an ideal case in which the magnetic field (for example, a Tx field) is uniform, Vdis may have a magnitude of 0 and SNR may have an infinite value.

Multiple conductors wound in the same direction are arranged in a horizontal direction (for example, a width direction) in the detection coil 1 in the comparative example in FIG. 1A and multiple conductors wound in different directions are arranged in the detection coil 100 in FIG. 1B in a horizontal direction (for example, a width direction). The SNR according to the detection coil 100 in FIG. 1B may be relatively higher than the SNR according to the detection coil 1 in FIG. 1A. In addition, when the conductors (for example, the first conductor 100a and the second conductor 100b) of the detection coil 100 in FIG. 1B are connected to each other in series, compared to the detection coil 1 in FIG. 1A, the number of channels required to detect the foreign object 2 may be relatively small. In addition, when the magnetic field generated around the detection coil is unbalanced, in the case of the detection coil 1 in FIG. 1A, regardless of the presence of the foreign object 2, the magnitude of the induced voltage V0 generated on each conductors (for example, the first conductor 1a or the second conductor 1b) fluctuates, so the accuracy of foreign object detection (FOD) is low, whereas in the detection coil 100 in FIG. 1, the induced voltages (for example, V0 and −V0) generated on each of parts (for example, a part corresponding to the first conductor 100a and a part corresponding to the second conductor 100b) of the sub coil connected in series are offset to each other, so the accuracy of foreign object detection (FOD) may be relatively high. When the parts (for example, the first conductor 100a and the second conductor 100b) of the sub coil are arranged not to overlap to each other, when the magnetic field generated around the detection coil is unbalanced, the presence of the foreign object may be incorrectly detected due to unoffset portions of induced voltages generated by the magnetic field.

Although not shown in the drawing, according to various embodiments, the parts (for example, the first conductor 100a and the second conductor 100b) of the sub coil may be arranged in surfaces different from each other (for example, stacking in a vertical direction), a first part (for example, a part corresponding to the first conductor 100a) disposed on a first surface and a second part (for example, a part corresponding to the second conductor 100b) are connected to each other in series to form one sub coil, and will be described in detail with reference to the drawing to be described below. The detection coil 100 including the parts (for example, a part corresponding to the second conductor 100b and a part corresponding to the second conductor 100b) arranged in different surfaces in the vertical direction may be referred to as a vertical-type gradiometer coil. The shape or arrangement of the parts of the sub coil connected in series described above will be described in detail with reference to a drawing to be described below. Hereinafter, the group of two conductors wound in different directions will be described as a "sub coil", the conductors wound in the clockwise direction or in the counterclockwise direction will be described as "a part of a sub coil", and the detection coil 100 will be described to include the one or more "sub coils".

Figure 2:
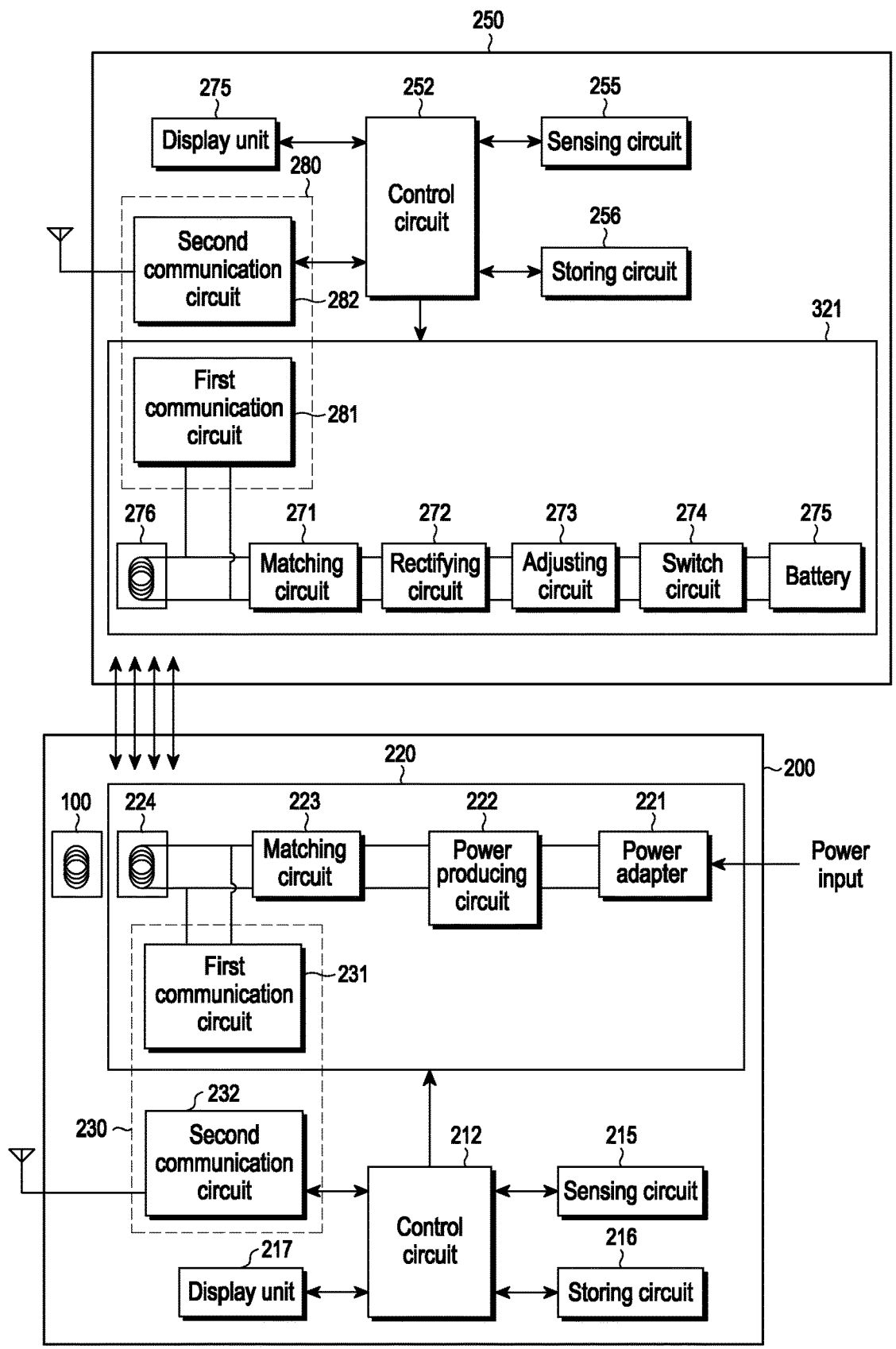
FIG. 2 illustrates a block diagram of a wireless power transmitter and a wireless power receptor according to various embodiments.

FIG. 2 illustrates a block diagram of a wireless power transmitter and a wireless power receptor according to various embodiments.

According to various embodiments, the wireless power transmitter 200 (for example, a wireless power device) may include a power transmitting circuit 220, a control circuit 212, a communication circuit 230, a sensing circuit 215, and/or a storing circuit 216.

According to various embodiments, the wireless power transmitter 200 may provide power to a wireless power receiver 250 through the wireless power transmitting circuit 220. For example, the wireless power transmitter 200 may transmit power according to a resonance method. In the resonance method, the wireless power transmitter 200 may be implemented in a manner defined by, for example, the alliance for wireless power standard (A4WP) (or air fuel alliance standard (AFA)). The wireless power transmitter 200 may include a conductive pattern 224 (for example, a coil) capable of generating an induced magnetic field (for example, a Tx field) when a current (for example, an alternating current) flows according to a resonance method or induction method. The process in which the wireless power transmitter 200 generates a magnetic field (for example, a Tx field) through the conductive pattern 224 may be described as outputting wireless power, and the process in which an induced electromotive force is generated on the wireless power receiver 250, based on a magnetic field (for example, a Tx field) generated through the conductive pattern 224 may be described as receiving wireless power. The wireless power transmitter 200 may be described to wirelessly transmit power to the wireless power receiver 250 through these processes. In addition, the wireless power receiver 250 may include a conductive pattern 276 (for example, a coil) to which an induced electromotive force is generated by a magnetic field (for example, a Tx field) formed therearound and changeable in size according to time. The process in which an alternative current is output from the conductive pattern 276 or an alternative current is applied to the conductive pattern 276 according to the generation of an induced electromotive force on the conductive pattern 276 of the wireless power receiver 250 may be described that the wireless power receiver 250 wirelessly receives power. For another example, the wireless power transmitter 200 may transmit power according to an induction method. In the induction method, the wireless power transmitter 200 may be implemented in a manner defined by, for example, the wireless power consortium standard (WPC) (or the Qi standard).

According to various embodiments, the power transmitting circuit 220 may include a power adapter 221, a power producing circuit 222, a matching circuit 223, a conductive pattern 224 (for example, a coil), or a first communication circuit 231. According to various embodiments, the power transmitting circuit 220 may be configured to wirelessly transmit power to the wireless power receiver 250 through the conductive pattern 224. According to various embodiments, the power transmitting circuit 220 may receive power from the outside in a direct current or alternating current waveform and may supply the received power to the wireless power receiver 250 in an alternating current waveform.

According to various embodiments, the power adapter 221 may receive a direct current or alternating current power from the outside or receive a power signal of a battery device so as to output a direct current having a configured voltage value. According to various embodiments, a voltage value of a direct current output from the power adapter 221 may be controlled by the control circuit 212. According to various embodiments, a direct current output from the power adapter 221 may be output to the power producing circuit 222.

According to various embodiments, the power producing circuit 222 may convert the direct current output from the power adapter 221 into an alternating current and output the alternating current. According to various embodiments, the power producing circuit 222 may include a predetermined amplifier (not shown). According to various embodiments, when a direct current input through the power adapter 221 is smaller than a configured gain, the power producing circuit 222 may amplify the direct current to the configured gain by using the amplifier (not shown). Alternatively, the power producing circuit 222 may include a circuit for converting, into an alternating current, a direct current input from the power adapter 221, based on a control signal input from the control circuit 212. For example, the power producing circuit 222 may convert, into an alternating current, a direct current input from the power adapter 221 through an inverter (not shown). Alternatively, the power producing circuit 222 may include a gate driving device (not shown). The gate driving device (not shown) may convert a direct current into an alternating current while controlling on/off of the direct current input from the power adapter 221. Alternatively, the power producing circuit 222 may generate an alternating current power signal through a wireless power generator (for example, an oscillator).

According to various embodiments, the matching circuit 223 may perform impedance matching. For example, when an alternating current (for example, an alternating current signal) output from the power producing circuit 222 is transferred to the conductive pattern 224, an electromagnetic field may be formed on the conductive pattern 224 by the transferred alternating current signal. A frequency band of the electromagnetic field (for example, an electromagnetic signal) to be generated may be controlled by adjusting impedance of the matching circuit 223. According to various embodiments, the matching circuit 223 may control an output power, transferred to the wireless power receiver 250 through the conductive pattern 224, to have high efficiency or high capacity by adjusting impedance. According to various embodiments, the matching circuit 223 may adjust impedance based on the control of the control circuit 212. The matching circuit 223 may include at least one of an inductor (for example, a coil), a capacitor, or a switch. The control circuit 212 may control a state of connection to at least one of the inductor or the capacitor through the switch and may perform impedance matching according thereto.

According to various embodiments, the conductive pattern 224 may form a magnetic field for inducing a current on the wireless power receiver 250 when a current is applied thereto. According to various embodiments, the first communication circuit 231 (for example, a resonance circuit) may perform communication (for example, data communication) in an in-band manner by using an electromagnetic field generated by the conductive pattern 224.

According to various embodiments, the detection coil 100 may include one or more sub coils (for example, a sub coil of which a part wound in the clockwise direction and a part wound in the counterclockwise direction are connected to each other in series). According to various embodiments, the parts of the sub coil may be arranged on different surfaces in directions perpendicular to each other. For example, with reference to one printed circuit board (PCB), a first part of the sub coil may be disposed on a first surface (for example, a lower surface) and a second part wound in a direction opposite to a direction in which the first part is wound may in disposed on a second surface (for example, an upper surface). More specifically, the second part may be disposed at a position corresponding to a perpendicular direction to a position at which the first part is disposed. For example, the part wound in the clockwise direction may be disposed on the upper surface and the part wound in the counterclockwise direction may be disposed on the lower surface. For another example, the part wound in the counterclockwise direction may be disposed on the upper surface and the part wound in the clockwise direction may be disposed on the lower surface. According to an embodiment, with reference to two PCBs, the first part of the sub coil may be disposed on a first PCB and the second part wound in an opposite direction to the first part may be disposed on a second PCB. According to various embodiments, the sub coils may be alternately arranged. For example, a part wound in the clockwise direction of a first sub coil may be disposed on a second surface (for example, the upper surface), a part wound in the counterclockwise direction of the first sub coil on a first surface (for example, the lower surface), a part wound in the counterclockwise direction of a second sub coil adjacent to the first sub coil on the second surface (for example, the upper surface), and a part wound in the clockwise direction on the first surface (for example, the lower surface). According to various embodiments, the sub coils adjacent to each other may be connected to each other in series. For example, the part of the first sub coil disposed on the second surface (for example, the upper surface) may be connected in series with the adjacent part of the second sub coil disposed on the first surface (for example, the lower surface, or the part of the first sub coil disposed on the first surface (for example, the lower surface) may be connected in series with the adjacent part of the second sub coil disposed on the second surface (for example, the upper surface). By way of example, adjacent sub coils may be connected to each other in series in one direction from a row direction or a column direction to form one channel. For another example, two of more sub coils connected to each other in series in the row direction or the column direction may be connected to each other to form one channel. For still another example, all sub coils arranged on one PCB are connected to each other to form one channel.

According to various embodiments, when viewed from one direction (for example, the vertical direction), adjacent sub coils may be arranged to at least partially overlap each other. According to various embodiments, in an overlapped area, the directions (for example, the clockwise direction or the counterclockwise direction) in which adjacent coils are wound may be identical to each other, and the description thereof will be given in detail with reference to a drawing to be described.

According to various embodiments, the parts wound in different directions and constituting the sub could of the detection coil 100 may have, when viewed from one direction (for example, the vertical direction), shapes having the same size (for example, the area) and/or different polygonal shapes (for example, polygonal shapes symmetrical to each other), and the description thereof will be given in detail with reference to a drawing to be described.

According to various embodiments, the wireless power transmitter 200 may include two or more detection coils (for example, the detection coil 100). For example, the wireless power transmitter 200 may include a first detection coil disposed on the first PCB and a second detection coil disposed on the second PCB (for example, the other PCB substantially parallel with the first PCB). According to various embodiments, the first detection coil and the second detection coil may form channels independent from each other. According to various embodiments, the first detection coil and the second detection coil may form channels independent of each other. According to various embodiments, when viewed from one direction (for example, the vertical direction), the first detection coil and the second detection coil may be arranged to be partially ed with each other. For example, the first detection coil and the second detection coil may be arranged so that an area other than a null area of a sub coil of the second detection coil covers at least one null area of a sub coil of the first detection coil. In addition, at least one null area of the sub coil of the second detection coil may be covered by an area other than a null area of the sub coil of the first detection coil, and the description thereof will be given below. For example, when viewed from one direction (for example, the vertical direction), the sub coil of the second detection coil disposed at a position may have a pattern corresponding to a pattern formed when the sub coil of the first detection coil disposed at the same position moves in parallel by a predetermined distance in the row direction and/or in the column direction, and/or is rotated by a predetermined angle. The description thereof will be given with reference to a drawing to be described below.

According to various embodiments, the sensing circuit 215 may sense a change in current/voltage applied to the conductive pattern 224 of the power transmission circuit 220. According to the change in current/voltage applied to the conductive pattern 224, an amount of power to be transferred to the wireless power receiver 250 may be changed. Alternatively, the sensing circuit 215 may sense and/or offset a current and/or voltage corresponding to at least one channel of the detection coil 100. In other cases, the sensing circuit 215 may sense a change in temperature of the wireless power transmitter 200. According to various embodiments, the sensing circuit 215 may include at least one of a current/voltage sensor or a temperature sensor.

According to various embodiments, the control circuit 212 may control an operation of the wireless power transmitter 200. For example, the control circuit 212 may control an operation of the wireless power transmitter 200 by using an algorithm, a program, or an application required to control the same and stored in the storing circuit 216. The control circuit 212 may be implemented in a form of a CPU, microprocessor, or minicomputer. For example, the control circuit 212 may display, based on a message received from the wireless power receiver 250 through the communication circuit 230, a state of the wireless power receiver 250 on a display unit 217.

According to various embodiments, the control circuit 212 may control to wirelessly transmit power to the wireless power receiver 250 through the wireless power transmitting circuit 220. According to various embodiments, the control circuit 212 may control to wirelessly receive information from the wireless power receiver 250 through the communication circuit 230. According to various embodiments, the control circuit 212 may identify an induced voltage and/or a value related to an induced voltage fluctuation output from the sensing circuit 215. According to various embodiments, the control circuit 212 may control at least a portion (for example, a compensating circuit 910 to be described below) of the sensing circuit 215, based on the value output from the sensing circuit 215, and the description thereof will be given in detail with reference to a drawing to be described below. According to various embodiments, the control circuit 212 may detect, based on the value output from the sensing circuit 215, the presence and/or location of a foreign object which may be affected by the magnetic field while wirelessly transmitting power through a conductive pattern 224 by being disposed around the detection coil 100. According to various embodiments, when the foreign object is detected around the detection coil 100, the control circuit 212 may perform a designated operation corresponding to the detection of the foreign object. For example, the control circuit 212 may not initiate an operation of wirelessly transmitting power to the wireless power receiver 250, and/or stop the operation of wirelessly transmitting power to the wireless power receiver 250. For another example, the control circuit 212 may output a notification (for example, an alarm sound) through an output device (for example, a speaker) of the wireless power transmitter 200, and/or control the wireless power receiver 250 to output a notification (for example, an alarm sound) through an output device (for example, a speaker).

According to an embodiment, the information received from the wireless power receiver 250 may include at least one of charging configuration information related to a battery state of the wireless power receiver 250, power amount control information related to an amount of power to be transmitted to the wireless power receiver 250, environment information related to a charging environment of the wireless power receiver 250, or time information of the wireless power receiver 250. According to an embodiment, the charging configuration information may be information related to a battery state of the wireless power receiver 250 at a time point of wireless charging between the wireless power transmitter 200 and the wireless power receiver 250. For example, the charging configuration information may include at least one of a total capacity of a battery of the wireless power receiver 250, a remaining battery amount, the number of charging times, battery usage, a charging mode, a charging method, or a wireless reception frequency band. According to an embodiment, the power amount control information may include information for controlling the amount of power transmitted according to a change in the amount of power charged in the wireless power receiver 250 during wireless charging between the wireless power transmitter 200 and the wireless power receiver 250. According to an embodiment, the environment information may be information obtained by measuring the charging environment of the wireless power receiver 250 by the sensing circuit 255 of the wireless power receiver 250, and may include, for example, at least one of temperature data including at least one of an internal temperature or an external temperature of the wireless power receiver 250, illuminance data indicating illuminance (brightness) around the wireless power receiver 250, or sound data indicating a sound (noise) around the wireless power receiver 250. According to an embodiment, the control circuit 212 may control, based on the charging configuration information among the information received from the wireless power receiver 250, to generate power to be transmitted to the wireless power receiver 250 or to transmit the power. Alternatively, the control circuit 212 may determine or change the amount of power to be transmitted to the wireless power receiver 250, based on at least a portion (for example, at least one of the power amount control information, the environment information, or the time information) of the information receive from the wireless power receiver 250. In other cases, the control circuit 212 may control the matching circuit 223 to change impedance.

According to various embodiments, the display unit 217 may display overall information related to a state of the wireless power transmitter 200, environment information, or a charge state.

According to various embodiments, the communication circuit 230 may perform communication with the wireless power receiver 250 in a predetermined manner. The communication circuit 230 may perform data communication with the communication circuit 280 of the wireless power receiver 250. For example, the communication circuit 230 may unicast, multicast, or broadcast a signal.

According to an embodiment, the communication circuit 230 may include at least one of a first communication circuit 231 implemented into one hardware together with the power transmitting circuit 220 so that the wireless power transmitter 200 may perform communication in an in-band manner, or a second communication circuit 232 implemented into hardware different from the power transmitting circuit 220 so that the wireless power transmitter 200 may perform communication in an out-of-band manner.

According to an embodiment, when the communication circuit 230 includes the first communication circuit 231 capable of performing communication in the in-band manner, the first communication circuit 231 may receive an electromagnetic field signal frequency and a signal level received through the conductive pattern 224 of the power transmitting circuit 220. The control circuit 212 may decode the electromagnetic field signal frequency and the signal level received through the conductive pattern 224 to extract information received from the wireless power receiver 250. Alternatively, the first communication circuit 231 may apply (for example, change impedance of a load (for example, the conductive pattern 224) according to an on/off keying modulation method), to the conductive pattern 224 of the power transmitting circuit 220, a signal with respect to the information on the wireless power transmitter 200 desired to be transmitted to the wireless power receiver 250, or add a signal with respect to the information on the wireless power transmitter 200 to an electromagnetic field signal generated by the application of a signal output from the matching circuit 223 to the conductive pattern 224, so as to transmit the information on the wireless power transmitter 200 to the wireless power receiver 250. The control circuit 212 may change a state of connection to at least one of the inductor and capacitor of the matching circuit 223 by controlling on/off of a switch device included in the matching circuit 223 so as to control the information of the wireless power transmitter 200 to be output.

According to an embodiment, when the communication circuit 230 includes the second communication circuit 232 capable of performing communication in the out-of-band manner, the second communication circuit 232 may perform communication with the communication circuit 280 (for example, the second communication circuit 282) of the wireless power receiver 250 by using near field communication (NFC), Zigbee communication, infrared communication, visible light communication, Bluetooth communication, or a Bluetooth low energy (BLE) method.

The communication methods of the communication circuit 230 described above are merely exemplary, and the scope of the right of the disclosure is not limited to a specific communication method performed by the communication circuit 230 in embodiments disclosed herein.

According to various embodiments, the wireless power receiver 250 (for example, a wireless power reception device) may include a power receiving circuit 270, a control circuit 252, a communication circuit 280, a sensing circuit 255, and/or a display unit 257.

According to various embodiments, the power receiving circuit 270 may receive power from the power transmitting circuit 220 of the wireless power transmitter 200. The power receiving circuit 270 may be implemented as an integrated battery form, or a power receiving interface form to receive power from the outside. The power receiving circuit 270 may include a matching circuit 271, a rectifying circuit 272, an adjusting circuit 273, a battery 275, and/or a conductive pattern 276.

According to various embodiments, the power receiving circuit 270 may receive, through the conductive pattern 276, wireless power in an electromagnetic wave form formed corresponding to a current/voltage applied to the conductive pattern 224 of the power transmitting circuit 220. For example, the power receiving circuit 270 may receive power by using an induced electromotive force formed on the conductive pattern 276 of the power receiving circuit 270 and the conductive pattern 224 of the power transmitting circuit 220.

According to various embodiments, the matching circuit 271 may perform impedance matching. For example, the power transmitted through the conductive pattern 224 of the wireless power transmitter 200 may be transferred to the conductive pattern 276 to form an electromagnetic field. According to various embodiments, the matching circuit 271 may adjust a frequency band of the electromagnetic field (for example, an electromagnetic signal) generated by adjusting impedance. According to various embodiments, the matching circuit 271 may control input power, received from the wireless power transmitter 200 through the conductive pattern 276, to have high efficiency and high capacity by such adjustment of impedance. According to various embodiments, the matching circuit 271 may adjust impedance based on the control of the control circuit 252. The matching circuit 271 may include at least one of an inductor (for example, a coil), a capacitor, or a switch device. The control circuit 252 may control a state of connection to at least one of the inductor or the capacitor through the switch and may perform impedance matching according thereto.

According to various embodiments, the rectifying circuit 272 may rectify the wireless power received by the conductive pattern 276 into a direct current form and may be implemented as, for example, a bridge diode form.

According to various embodiments, the adjusting circuit 273 may convert the rectified current with a configured gain. The adjusting circuit 273 may include a DC/DC converter (not shown). For example, the adjusting circuit 273 may convert the rectified current so that a voltage of an output terminal becomes 5V. Alternatively, a minimum value or a maximum value of the voltage applicable to a front end of the adjusting circuit 273 may be configured.

According to various embodiments, a switch circuit 274 may connect the adjusting circuit 273 and the battery 275. According to various embodiments, the switch circuit 274 may maintain an on/off state according to control of the control circuit 252.

According to various embodiments, the battery 275 may be charged by receiving power input from the adjusting circuit 273.

According to various embodiments, the sensing circuit 255 may sense a state change of power received by the wireless power receiver 250. For example, the sensing circuit 255 may periodically or aperiodically measure a value of a current/voltage received by the conductive pattern 276 through a predetermined current/voltage sensor 255*a*. According to various embodiments, the wireless power receiver 250 may calculate the amount of power received by the wireless power receiver 250, based on the current/voltage measured by the predetermined current/voltage sensor 255*a*. According to various embodiments, the sensing circuit 255 may sense a change in a charging environment of the wireless power receiver 250. For example, the sensing circuit 255 may periodically or aperiodically measure at least one of an internal temperature or external temperature of the wireless power receiver 250 through a predetermined temperature sensor 255*b*.

According to various embodiments, the display unit 257 may display overall information related to a charging state of the wireless power receiver 250. For example, the display unit 257 may display at least one of a total capacity of a battery of the wireless power receiver 250, a remaining battery amount, a charged battery amount, battery usage, or expected charging time.

According to various embodiments, the communication circuit 280 may perform communication with the wireless power transmitter 200 in a predetermined manner. The communication circuit 280 may perform data communication with the communication circuit 230 of the wireless power transmitter 200. According to various embodiments, the communication circuit 280 may operate similarly or identically to the communication circuit 230 of the wireless power transmitter 200.

According to various embodiments, the control circuit 252 may transmit, to the wireless power transmitter 200 through the communication circuit 280, the charging configuration information for receiving a required amount of power, based on information related to a state of a battery of the wireless power receiver 250. For example, when the wireless power transmitter 200 is identified, the control circuit 252 may transmit, to the wireless power transmitter 200 through the communication circuit 280, the charging configuration information for receiving a required amount of power, based on at least one of a total capacity of a battery of the wireless power receiver 250, a remaining battery amount, the number of charging times, battery usage, a charging mode, a charging method, or a wireless reception frequency band.

According to various embodiments, the control circuit 252 may transmit, to the wireless power transmitter 200 through the communication circuit 280, the power amount control information for controlling an amount of power received from the wireless power transmitter 200 according to a change in an amount of power charged in the wireless power receiver 250.

According to various embodiments, the control circuit 252 may transmit, to the wireless power transmitter 200 through the communication circuit 280, the environment information according to a charging environment of the wireless power receiver 250. For example, when a temperature data value measured by the sensing circuit 255 is more than or equal to a configured temperature reference value, the control circuit 252 may transmit the measured temperature data to the wireless power transmitter 200.

According to an embodiment, the wireless power receiver 250 may include a detection coils 100. When a change in an induced voltage is identified by using the detection coil 100, the wireless power receiver 250 may detect the presence and/or location of a foreign object (FO). When the foreign object is detected, the wireless power receiver 250 (for example, the control circuit 252) may control the switch circuit 274 to be an off state, and/or transmit, to the wireless power transmitter 200, information indicating that the foreign object has been detected.

FIG. 2 illustrates that the wireless power transmitter 200 and the wireless power receiver 250 include the power transmitting circuit 220 and the power receiving circuit 270, respectively, but the wireless power transmitter 200 and the wireless power receiver 250 each may include both the power transmitting circuit 220 and the power receiving circuit 270. Therefore, according to various embodiments, the wireless power transmitter 200 and the wireless power receiver 250 may perform both the functions of a transmitter and a receiver.

Figure 3A:
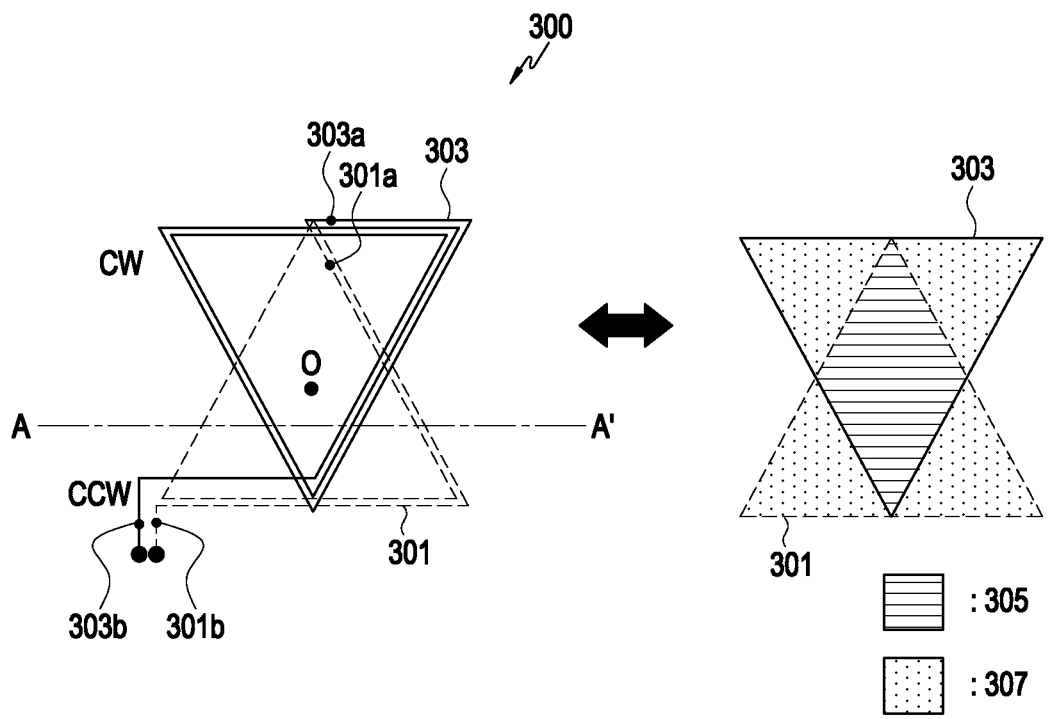
FIG. 3A illustrates an example of a sub coil included in a detection coil according to various embodiments.
Figure 3B:
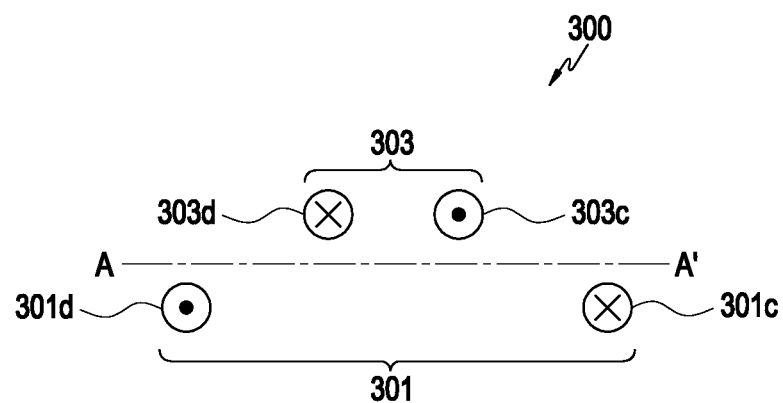
FIG. 3B illustrates an cross-sectional view of the sub coil in FIG. 3A according to various embodiments.

FIG. 3A illustrates an example of a sub coil 300 included in a detection coil (for example, the detection coil 100 in FIG. 1B) according to various embodiments. FIG. 3B illustrates a cross-sectional view of the sub coil 300 in FIG. 3A according to various embodiments.

Referring to FIG. 3A, according to various embodiments, the sub coil 300 may include parts 301 and 303 wound in different directions. For example, the sub coil 300 may include a first part 301 wound in the counterclockwise direction (CCW) and a second part 303 wound in the clockwise direction (CW).

According to various embodiments, the parts 301 and 303 of the sub coil 300 may be formed in polygonal shapes. For example, when viewed from one direction (for example, the front direction of the sub coil 300), the first part 301 may have a triangular (for example, a regular triangle) shape. When viewed from one direction (for example, the front direction of the sub coil 300), the second part 303 may have a triangular (for example, an inverted triangle) shape. According to an embodiment, the parts 301 and 303 of the sub coil 300 wound in different directions may be formed to have polygonal shapes, other than the triangular shape, such as square, pentagon, or hexagon, or to have a circular shape.

According to various embodiments, the parts 301 and 303 of the sub coil 300 wound in different directions may have shapes of substantially the same size (for example, the area). For example, in the sub coil 300, the area (for example, the triangular area) formed by the first part 301 may be substantially the same as the area (for example, the inverted triangular area) formed by the second part 303, without limitation thereto.

According to various embodiments, when viewed from one direction (for example, the front direction of the sub coil 300), the parts 301 and 303 of the sub coil 300 wound in different directions may have different polygonal shapes. For example, when viewed from one direction (for example, the front direction of the sub coil 300), the first part 301 may have a regular triangular shape. When viewed from one direction (for example, the front direction of the sub coil 300), the second part 303 may have an inverted triangular shape.

According to various embodiments, the parts 301 and 303 of the sub coil 300 wound in different directions may have shapes symmetrical to each other. For example, when viewed from one direction (for example, the front direction of the sub coil 300), the center O (for example, the center of mass) of the first part 301 may match the center O (for example, the center of mass) of the second part 303, and the first part 301 and the second part 303 may have shapes symmetrical to each other with reference to one axis. By way of example, the second part 303 may have a shape obtained when the shape of the first part 301 rotates by 180 degrees (for example, point symmetry) with reference to an axis passing through the center O (for example, the center of mass) in a vertical direction (for example, the front direction of the sub coil 300). For another example, the second part 303 may have a shape obtained when the shape of the first part 301 is reversed (for example, vertical inversion) (for example, line symmetry) with reference to an axis passing through the center O (for example, the center of mass) in a horizontal direction (for example, the lateral direction of the sub coil 300). In such a manner, the parts 301 and 303 of the sub coil 300 wound in different directions may share the same center O and have shapes symmetrical to each other, and therefore, even when the detection coil 100 including the sub coil 300 is disposed in an imbalance magnetic field (for example, a Tx field), the induced voltages generated in the sub coil 300 may be effectively offset. For example, the first part 301 and the second part 303 may overlap each other by a first area 305. Based on that the first part 301 and the second part 303 wound in different directions overlap each other by the first area 305, the induced voltages generated on each of the first part 301 and the second part 303 may be mostly offset. Even when a foreign object 2 is disposed on (or around) the first area 305, the induced voltages (for example, a change in induced voltages) may be offset so that the change in induced voltages may not be detected, and the first area 305 may be described as a null area. As the parts 301 and 303 of the sub coil 300 wound in different directions have the shapes symmetrical to each other, at least a portion of an area forming the parts 301 and 303 may not overlap each other. For example, the first part 301 and the second part 303 may not overlap each other by a second area 307. Based on that the first part 301 and the second part 303 do not overlap each other by the second area 307, when the foreign object 2 is disposed on (or around) at least a portion of the second area 307, at least a portion of the induced voltages (for example, a change in induced voltages) generated on each of the first part 301 and the second part 303 may not be offset. For example, when the foreign object 2 is disposed at a left lower end of the second part 303, the induced voltage generated on the first part 301 may fluctuate, but the induced voltage generated on the second part 303 may not fluctuate, and thus the induced voltages may not be completely offset. Through this, the change in induced voltages generated on the sub coil 300 may be detected, and the second area 307 may be described as a detection area. According to various embodiments, a voltage difference Vout between the other end 301b of the first part 301 and the other end 303b of the second part 303 may be calculated, for example, according to Equation 3.

$$V_{out}=V_{CW}-V_{CCW}=N_{CW}(V_0 \pm V_{xCW})-N_{CCW}(V_0 \pm V_{xCCW})= V_0(N_{CW}-N_{CCW}) \pm (Y_{xCW}N_{CW}-V_{xCCW}N_{CCW}) \quad \text{Equation 3}$$

In Equation 3, "VCW−VCCW" represents a voltage difference between the other end 301b of the first part 301 and the other end 303b of the second part 303. "NCCW" and "NCW" represent the number of turns of the first part 301 and the number of turns of the second part 303, respectively. "V0" represents a size per 1 turn of an induced voltage generated on the first part 301 or the second part 303. "VxCCW" and "VxCW" represent a size per 1 turn of a change in induced voltage generated on the first part 301 and the second part 303, respectively. When a size of the sub coil 300 is small enough (for example, smaller than the foreign object disposed around the same), magnetic field densities for interlinking the first part 301 and the second part 303 of the sub coil 300 are the same, and thus the induced voltages having the same size (V0) may be generated on the same. When the numbers of turns of the first part 301 and the second part 303 (for example, NCCW=NCW) are the same, the induced voltages generated on each of the same may be offset to each other (for example, V0(NCW−NCCW)≈0). Accordingly, by measuring the voltage difference Vout between the other end 301b of the first part 301 and the other end 303b of the second part 303, the presence and/or location of the foreign object around the sub coil 300 may be detected.

According to various embodiments, the parts 301 and 303 of the sub coil 300 may be wound multiple turns. For example, the first part 301 may be formed by being wound multiple turns in the counterclockwise direction. The second part 303 may be formed by being wound multiple turns in the clockwise direction. For example, each of the first part 301 and the second part 303 may be wound in the counterclockwise direction or clockwise direction multiple turns to be formed in polygonal shapes (for example, a triangular shape or inverted triangular shape).

According to various embodiments, the parts 301 and 303 of the sub coil 300 wound in different directions may be connected to each other. For example, one end 301a of the first part 301 may be connected to one end 303a of the second part 303 so that the first part 301 and the second part 303 are connected to each other. In an example, the sub coil 300 may further include a connecting conductor extending in a vertical direction to connect the one end 301a of the first part 301 and the one end 303a of the second part 303. When the first part 301 and the second part 303 are disposed on opposite surfaces of a PCB, the connecting conductor may connect the first part 301 and the second part 303 through a via hole passing through the PCB, but a connector for connecting both parts 301 and 303 has no limitation. More specifically, the first part 301 wound in the counterclockwise direction one or more turns is formed and then the second part 303 wound in the clockwise direction one or more turns is formed from the one end 301a of the first part 301 so as to form the sub coil 300 including the first part 301 and the second part 303 wound in different directions. For example, FIG. 3B illustrates the cross-sectional view of the sub coil 300 taken along A-A' in FIG. 3A. According to various embodiments, when viewed from one direction (for example, the front direction of the sub coil 300), the first part 301 of the sub coil 300 may be formed to be wound in the counterclockwise direction, enter at a first point 301c in the front direction of the sub coil 300, and exit at a second point 301d from the front direction of the sub coil 300. The first part 301 may be elongated from the first point 301c to one end 301a and the one end 301a may be connected to one end 303a of the second part 303. When viewed from one direction (for example, the front direction of the sub coil 300), the second part 303 of the sub coil 300 may be formed to be wound in the clockwise direction, exit at a third point 303c from the front direction of the sub coil 300, and enter at a fourth point 303d to the front direction of the sub coil 300.

According to various embodiments, the other end 301b of the first part 301 and/or the other end 303b of the second part 303 may be connected to a sensing circuit (for example, the sensing circuit 215 in FIG. 2). According to various embodiments, when the detection coil 100 includes multiple sub coils 300 shown in FIG. 3, the other end 301b of the first part 301 and/or the other end 303b of the second part 303 may be connected (for example, connected in series) to a first part and/or a second part of an adjacent sub coil, and the description thereof will be given in detail with reference to a drawing to be described below.

According to various embodiments, the parts 301 and 303 of the sub coil 300 wound in different directions may be disposed on surfaces different from each other. For example, referring to FIG. 3B, the first part 301 may be disposed on a first surface and the second part 303 may be disposed on a second surface different from the first surface. By way of example, the sub coil 300 may be disposed on both surfaces of a PCB, and the first part 301 may be disposed on the first surface (for example, the lower surface) of the PCB and the second part 303 may be disposed on the second surface (for example, the upper surface) of the PCB. The one end 301a of the first part 301 and the one end 303a of the second part 303 may be connected to each other through the PCB. According to various embodiments, when the detection coil 100 includes multiple sub coils 300 shown in FIG. 3A, the other end 301b of the first part 301 may be connected to a first part of an adjacent sub coil (for example, the adjacent sub coil disposed on the same PCB), and/or the other end 303b of the second part 303 may be connected to a second part of an adjacent sub coil (for example, the adjacent sub coil disposed on the same PCB), and the description thereof will be given in detail with reference to a drawing to be described below. In this case, the first part of the adjacent sub coil may be disposed on the second surface (for example, the upper surface) and the second part of the adjacent sub coil may be disposed on the first surface (for example, the lower surface). By way of example, the other end 301b of the first part 301 disposed on the first surface may be connected to one end of the first part of the adjacent sub coil disposed on the second surface through the PCB, and/or the other end 303b of the second part 303 disposed on the second surface may be connected to one end of the second of the adjacent sub coil disposed on the first surface through the PCB.

According to various embodiments, the sub coil 300 may be connected (for example, connected in series) to at least one adjacent sub coil to form one channel. According to an embodiment, the sub coils of the detection coil 100 may respectively form independent (for example, respective) channels.

Figure 4A:
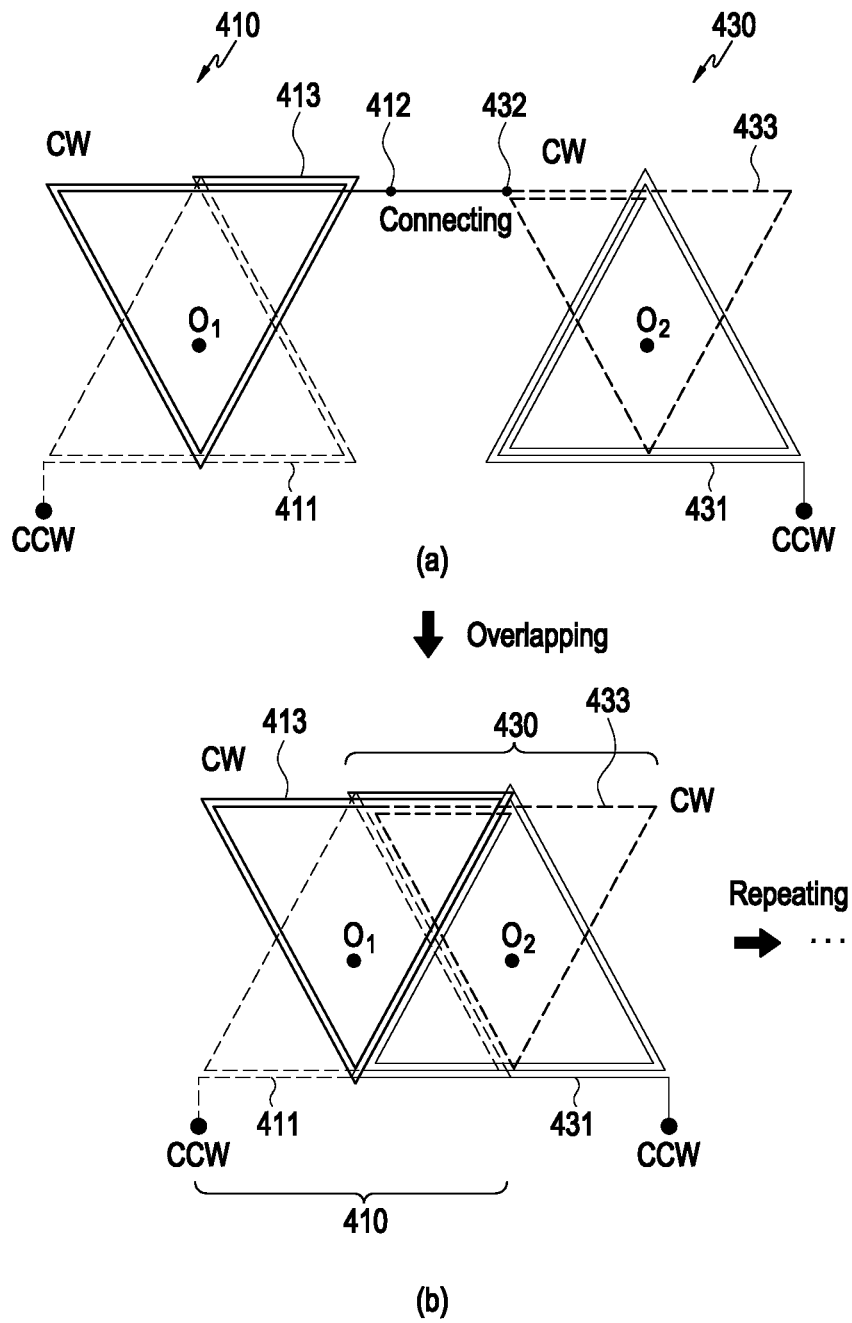
FIG. 4A is a diagram illustrating arrangement and/or connection relationship of adjacent sub coils according to various embodiments.
Figure 4B:
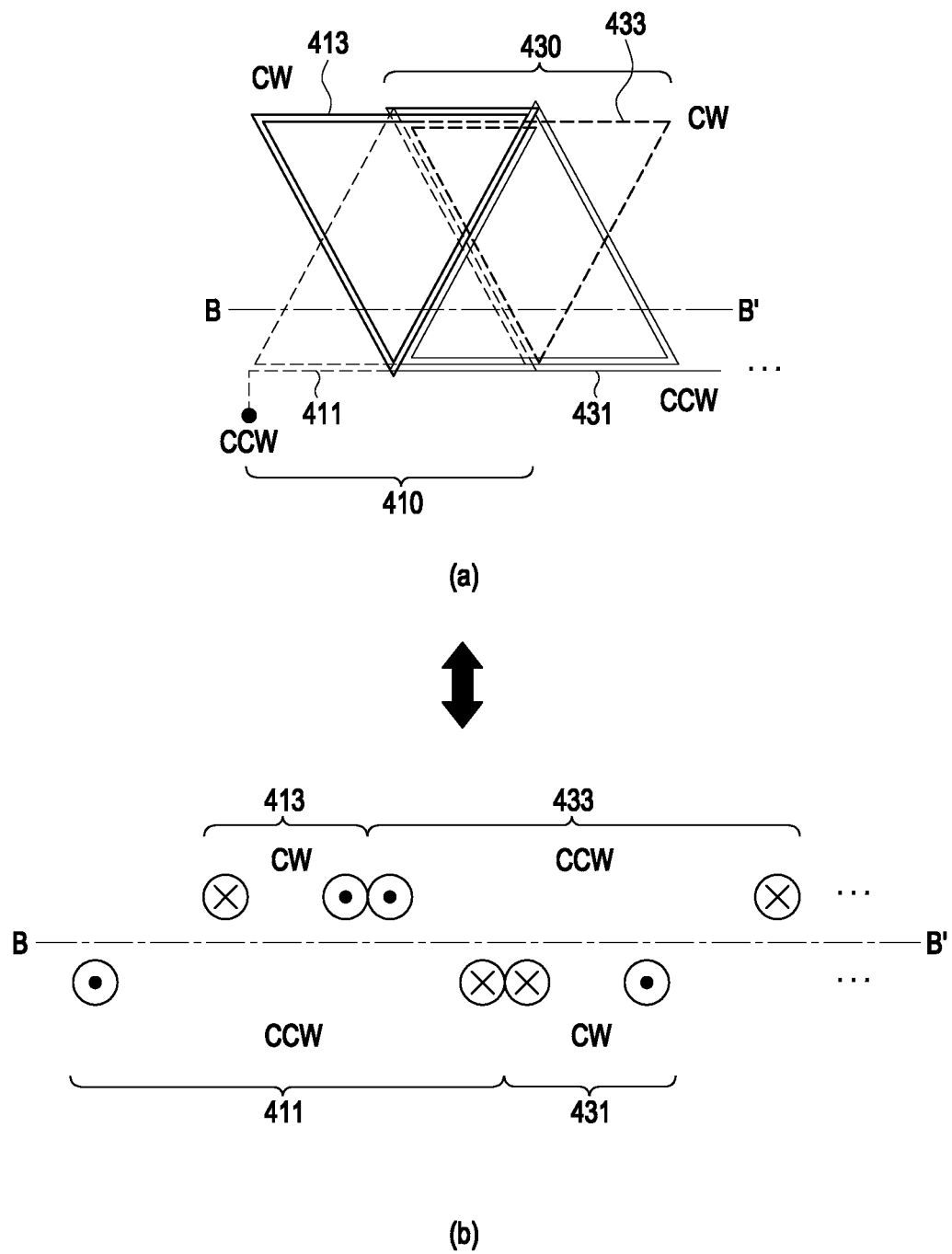
FIG. 4B illustrates an cross-sectional view of a detection coil including multiple sub coils according to various embodiments.

FIG. 4A is a diagram illustrating arrangement and/or connection relationship of adjacent sub coils 410 and 430 (for example, the sub coil 300 in FIG. 3A) according to various embodiments. FIG. 4B illustrates a cross-sectional view of a detection coil 100 including multiple sub coils 410 and 430 according to various embodiments.

Referring to (a) and (b) in FIG. 4A, a method for forming the detection coil 100 including multiple sub coils is illustrated. According to various embodiments, a first sub coil 410 (for example, the sub coil 300 in FIG. 3A) may include a first part 411 wound in the counterclockwise direction (CCW) and a second part 413 wound in the clockwise direction (CW). According to various embodiments, a second sub coil 430 (for example, the sub coil 300 in FIG. 3A) may include a first part 431 wound in the counterclockwise direction (CCW) and a second part 433 wound in the clockwise direction (CW).

According to various embodiments, the first sub coil 410 may be disposed be connected (for example, connected in series) to the second sub coil 430 adjacent thereto. For example, referring to (a) in FIG. 4A, one end 412 (for example, the other end 303b in FIG. 3A) of the second part 413 of the first sub coil 410 may be disposed to be connected to one end 432 (for example, the one end 303a in FIG. 3A) of the second part 433 of the adjacent second sub coil 430. According to various embodiments, when the detection coil 100 includes three or more sub coils, the first part 411 of the first sub coil 410 or the first part 431 of the second sub coil 430 may be disposed to be connected (for example, connected in series) to a first part of an adjacent third sub coil (not shown). The third sub coil (not shown) may be disposed so that the center of mass thereof is located (for example, in parallel in a row direction) on an extension line connecting the center O1 (for example, the center of mass) of the first sub coil 410 and the center O2 (for example, the center of mass) of the second sub coil 430.

According to various embodiments, when viewed from one direction (for example, the front direction of the sub coils 410 and 430), adjacent sub coils 410 and 430 may be arranged to at least partially overlap each other. For example, parts of the first sub coil 410 and the second sub coil 430 wound in the same direction (for example, the clockwise direction or the counterclockwise direction) may partially overlap each other. For example, referring to (b) in FIG. 4A, in the first sub coil 410 and the second sub coil 430, the first part 411 wound in the counterclockwise direction and the first part 431 wound in the counterclockwise direction may be disposed to partially overlap each other, and the second part 413 wound in the clockwise direction and the second part 433 wound in the clockwise direction may be disposed to partially overlap each other. According to various embodiments, when the detection coil 100 includes three or more sub coils, the first part 411 (or the first part 431) of the first sub coil 410 (or the second sub coil 430) wound in the counterclockwise direction may at least partially overlap the first part of the third sub coil (not shown) wound in the counterclockwise direction, and the second part 413 (or the second part 433) of the first sub coil 410 (or the second sub coil 430) wound in the clockwise direction may at least partially overlap the second part of the third sub coil (not shown) wound in the clockwise direction. According to various embodiments, through an area in which the first parts of the adjacent sub coils overlap each other and/or an area in which the second parts of the adjacent sub coils overlap each other, an induced voltage change generated when a foreign object is disposed around the sub coils 410 and 430 may increase (for example, two-fold), and the description thereof will be given in detail with reference to a drawing to be described below.

According to various embodiments, the adjacent sub coils 410 and 430 may be alternately arranged. By way of example, referring to (a) and (b) in FIG. 4B, the first sub coil 410 may be disposed so that the first part 411 is positioned on a first surface (for example, the lower surface) of a PCB and the second part 413 is positioned on a second surface (for example, the upper surface) of the PCB. The second sub coil 430 adjacent to the first sub coil 410 may be disposed so that the first part 431 is positioned on the second surface (for example, the upper surface) of the PCB and the second part 433 is positioned on the first surface (for example, the lower surface) of the PCB. Although not shown, the third sub coil (not shown) adjacent to the second sub coil 430 may be disposed so that the first part is positioned on the first surface (for example, the lower surface) of the PCB and the second part is positioned on the second surface (for example, the upper surface) of the PCB. The arrangement of the multiple sub coils described above may be summarized in, for example, Table 1.

TABLE 1

| Winding | First sub coil | | Second sub coil | | Third sub coil | | ... |
|---|---|---|---|---|---|---|---|
| direction | CCW | CW | CW | CCW | CCW | CW | ... |
| Disposition layer | Lower | Upper | Lower | Upper | Lower | Upper | ... |

Figure 5A:
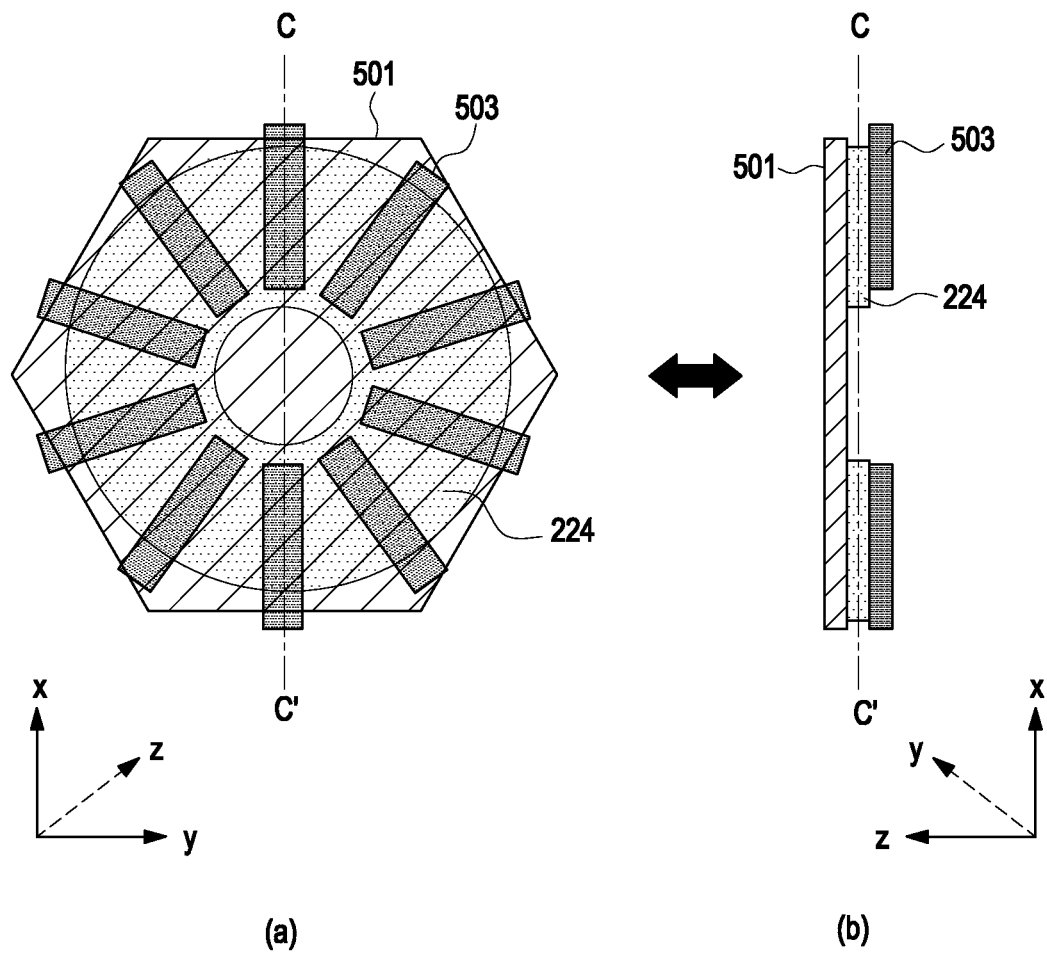
FIG. 5A is a diagram illustrating arrangement of a detection coil according to various embodiments.
Figure 5B:
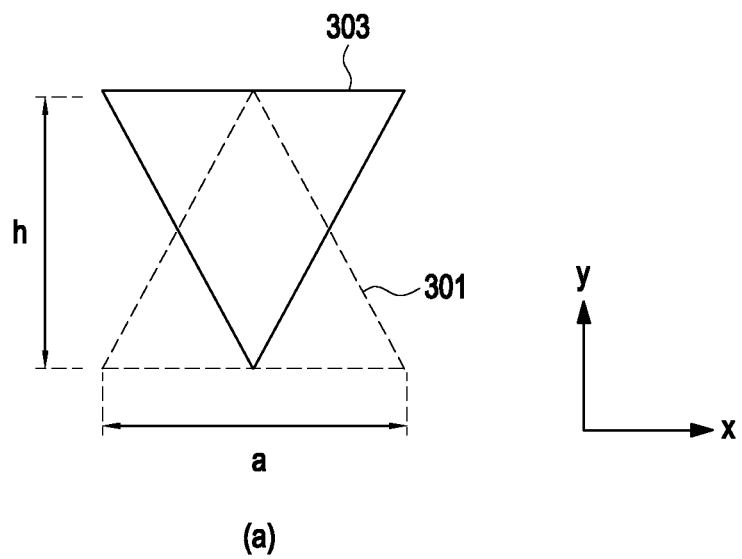
FIG. 5B is a diagram illustrating an area covered by a detection coil according to various embodiments.
Figure 5B:
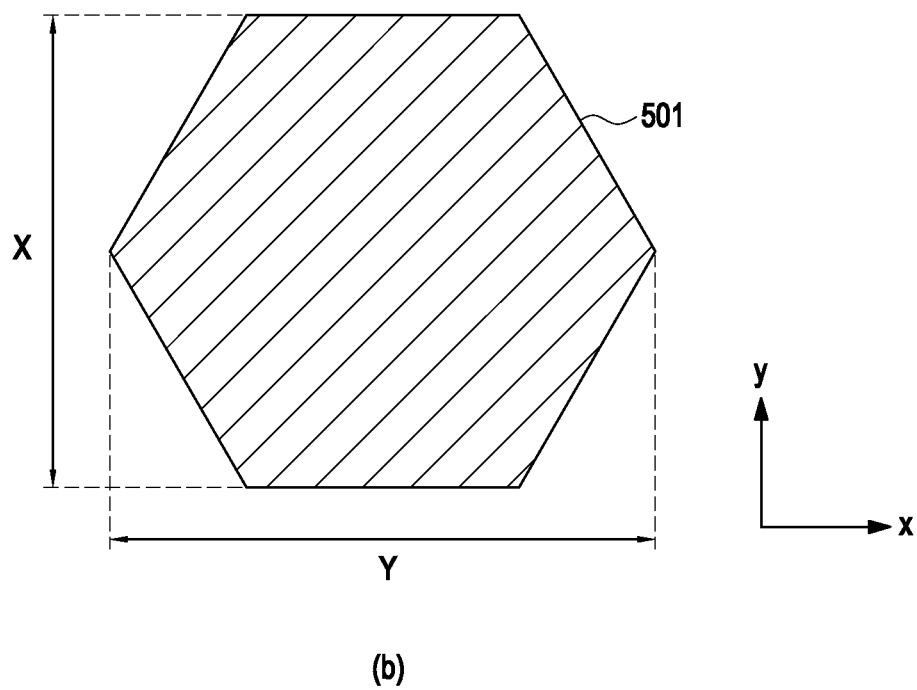

FIG. 5A is a diagram illustrating arrangement of a detection coil (for example, the detection coil 100 in FIG. 2) according to various embodiments. FIG. 5B is a diagram illustrating an area covered by a detection coil (for example, the detection coil 100 in FIG. 2) according to various embodiments. Referring to (a) and (b) in FIG. 5A, the coverage area 501 may be an area in which the detection coil 100 is disposed. According to various embodiments, the detection coil 100 may be disposed to cover the conductive pattern 224. For example, the detection coil 100 may be disposed to exceed the area of the conductive pattern 224 with reference to x-y surface. For example, sub coils (for example, the sub coil 300 in FIG. 3A) of the detection coil 100 may be disposed to occupy the coverage area 501 having a hexagonal shape. According to various embodiments, the detection coil 100 may be disposed on the upper (for example, +z direction) with respect to the conductive pattern 224 and the ferrite 503.

Referring to (a) in FIG. 5A, one of sub coils (for example, the sub coil 300 in FIG. 3A) included in the detection coil 100 is illustrated. For example, the sub coil 300 may include a first part (for example, the first part 301 in FIG. 3A) of a regular triangle having a width (for example, a length in x-axis direction) of a, and a length (or height) (for example, a length in y-axis direction) of h, and a second part (for example, the second part 303 in FIG. 3A) of an inverted triangle.

Referring to (b) in FIG. 5b, the coverage area 501 is illustrated. For example, the coverage area 501 may have a width (for example, a length in x-axis direction) of X and a length (for example, a length in y-axis direction) of Y. According to various embodiments, in order for the sub coils (for example, the sub coil 300) of the detection coil 100 to occupy the coverage area 501 having a width of X and a length of Y, the detection coil 100 may include m sub coils in the width direction (for example, x-axis direction) and n sub coils in the length direction (for example, y-axis direction) and the relationship between m and n may be calculated by Equation 4 to Equation 6.

$$X = \frac{a}{2}(m+1) \qquad \text{Equation 4}$$

$$Y = \frac{\sqrt{3}\,a}{2}n \qquad \text{Equation 5}$$

$$n = \frac{(m+1)}{\sqrt{3}} \qquad \text{Equation 6}$$

Figure 6:
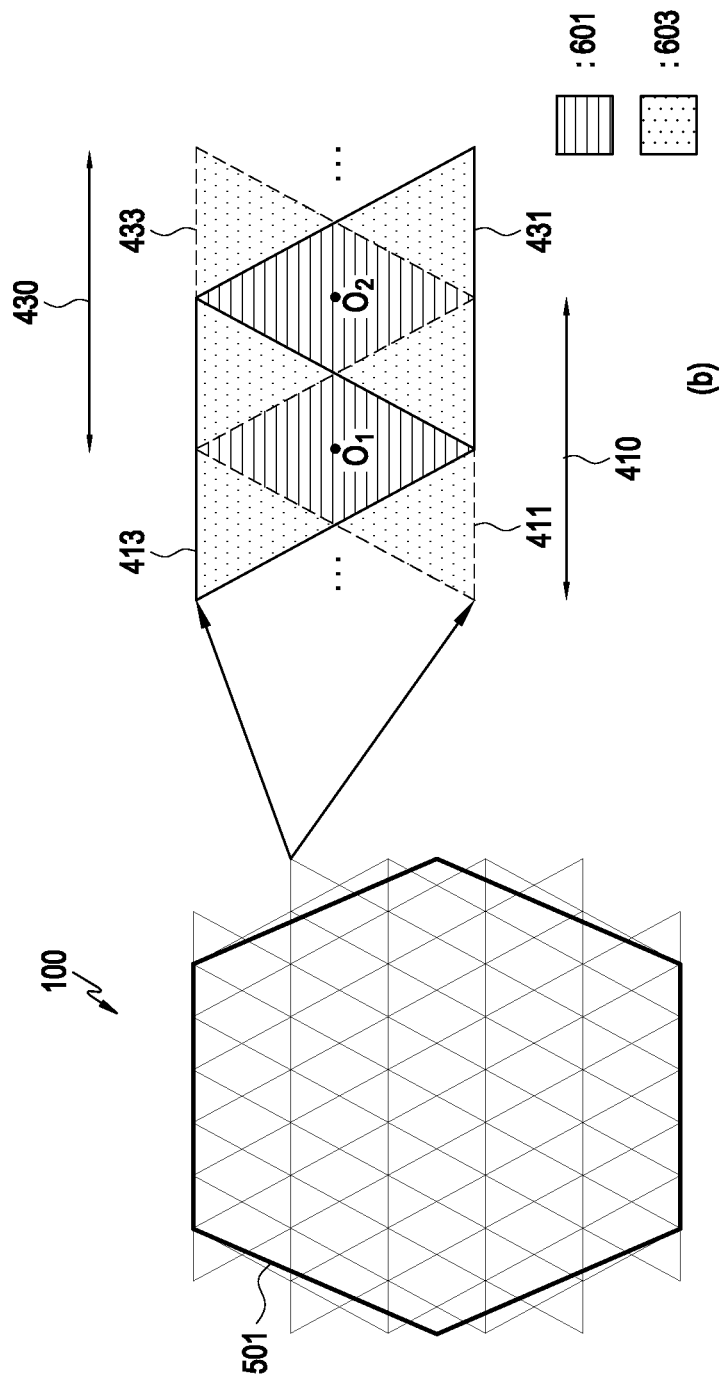
FIG. 6 is a diagram illustrating arrangement of adjacent sub coils according to various embodiments.

FIG. 6 is a diagram illustrating arrangement of adjacent sub coils 410 and 430 according to various embodiments.

Referring to (a) in FIG. 6, the detection coil 100 may include sub coils (for example, the sub coil 300 in FIG. 3A) configured to cover the coverage area 501. According to various embodiments, the sub coils (for example, the sub coil 300) may be connected in series with adjacent sub coils, and may be arranged, when viewed from one direction (for example, the front direction of the detection coil 100), to at least partially overlap an adjacent sub coil.

Referring to (b) in FIG. 6, an enlarged view of a portion of the detection coil 100 in a row direction is illustrated.

According to various embodiments, the first sub coil 410 and the second sub coil 430 may be alternately arranged on the same PCB. Referring to (b) in FIG. 6, portions of each sub coil indicated by a "dotted line" may represent portions located on a first surface (for example, the lower surface) of the PCB, and portions of each sub coil indicated by a "solid line" may represent portions located on a second surface (for example, the upper surface) of the PCB. In such a manner, on the first surface (for example, the lower surface), the first part 411 of the first sub coil 410 and the second part 433 of the second sub coil 430 may be arranged adjacent to each other while not overlapping each other, and on the second surface (for example, the upper surface), the second part 413 of the first sub coil 410 and the first part 431 of the second sub coil 430 may be arranged adjacent to each other while not overlapping each other. Although not shown, other sub coils may be disposed at the left side of the first sub coil 410 or the right side of the second sub coil 430, and the different sub coils may be arranged so that the center thereof is aligned on an extension line connecting the center O1 of the first sub coil 410 and the center O2 of the second sub coil 430.

According to various embodiments, the first sub coil 410 and the second sub coil 430 may be arranged so that, when viewed from one direction (for example, the front direction of the sub coils 410 and 430), parts wound in the same direction overlap each other. For example, when viewed from one direction (for example, the front direction of the sub coils 410 and 430), the first part 411 of the first sub coil 410 wound in the counterclockwise direction may overlap the first part 431 of the adjacent second sub coil 430 wound in the counterclockwise direction. When viewed from one direction (for example, the front direction of the sub coils 410 and 430), the second part 413 of the first sub coil 410 wound in the clockwise direction may overlap the second part 433 of the adjacent second sub coil 430 wound in the clockwise direction.

According to various embodiments, the first sub coil 410 and the second sub coil 430 may be arranged so that, when viewed from one direction (for example, the front direction of the sub coils 410 and 430), parts wound in different directions do not overlap each other. For example, when viewed from one direction (for example, the front direction of the sub coils 410 and 430), the first part 411 of the first sub coil 410 wound in the counterclockwise direction may not overlap the second part 433 of the adjacent second sub coil 430 wound in the clockwise direction. When viewed from one direction (for example, the front direction of the sub coils 410 and 430), the second part 413 of the first sub coil 410 wound in the clockwise direction may not overlap the first part 431 of the adjacent second sub coil 430 wound in the counterclockwise direction.

According to various embodiments, reference numeral 601 indicates a first area (for example, the first area 305 in FIG. 3A) (in other words, a null area) of the first sub coil 410 and/or the second sub coil 430, and reference numeral 603 indicates a second area (for example, the second area 307 in FIG. 3A) (in other words, a detection area) of the first sub coil 410 and/or the second sub coil 430. As shown in the drawing, the detection area of the first sub coil 410 may overlap the detection area of the second sub coil 430 and the detection area of a sub coil (not shown) adjacent to the left side thereof, and the detection area of the second sub coil 430 may overlap the detection area of the first sub coil 410 and the detection area of a sub coil (not shown) adjacent to the right side thereof. For example, a lower area of the areas indicated by reference numeral 603 may represent an area in which the detection areas formed by the first parts (for example, the parts wound in the counterclockwise direction) of the adjacent sub coils overlap each other and an upper area of the areas indicated by reference numeral 603 may represent an area in which the detection areas formed by the second parts (for example, the parts wound in the clockwise direction) of the adjacent sub coils overlap each other. According to various embodiments, the accuracy of foreign object detection (FOD) through the overlapping detection areas may increase, based on that the detection area of each sub coil overlaps at least a portion of the detection areas of adjacent sub coils. For example, based on that the detection areas formed by the parts (for example, the first part or the second part) wound in the same direction (for example, the clockwise direction or the counterclockwise direction) overlap each other, a signal to noise ratio (SNR) of an induced voltage change generated through each detection area may increase by the number of overlaps (for example, two-fold).

Figure 7:
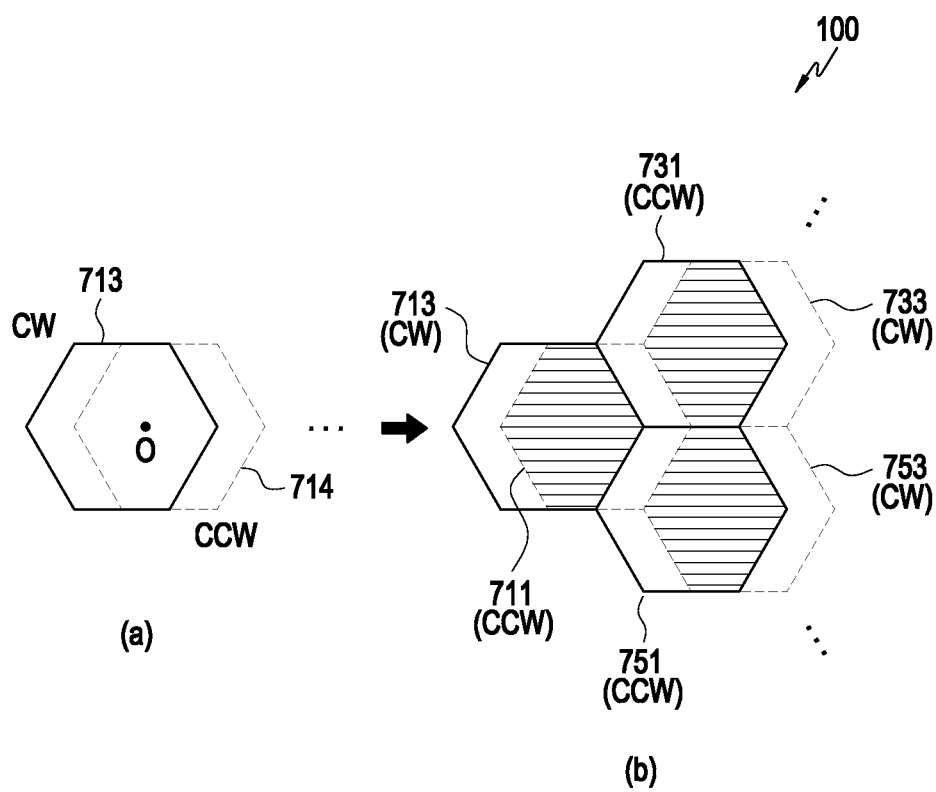
FIG. 7 is a diagram illustrating arrangement and/or connection relationship between regular hexagon-shaped sub coils according to various embodiments.

FIG. 7 is a diagram illustrating arrangement and/or connection relationship between regular hexagon-shaped sub coils 710, 730, and 750 (for example, the sub coil 300 in FIG. 3A) according to various embodiments.

Referring to (a) in FIG. 7, according to various embodiments, the first sub coil 710 may include a first part 711 wound in the counterclockwise direction and a second part 713 wound in the clockwise direction. According to various embodiments, the first part 711 and the second part 713 may have a regular hexagonal shape. According to various embodiments, the second part 713 may have a shape obtained when the shape of the first part 711 rotates by 180 degrees (for example, point symmetry) with reference to an axis passing through one point in a vertical direction. According to various embodiments, the second part 713 may have a shape obtained when the shape of the first part 711 is vertically inverted (for example, line symmetry) with reference to an axis passing through one point in a vertical direction.

According to various embodiments, the first part 711 and the second part 713 may be connected (for example, connected in series) to each other. According to various embodiments, the first part 711 may be disposed on the first surface (for example, the lower surface) of the PCB and the second part 713 may be disposed on the second surface (for example, the upper surface) of the PCB. Referring to (a) and (b) in FIG. 7, portions indicated by a "dotted line" represent portions located on the first surface (for example, the lower surface) of the PCB, and portions indicated by a "solid line" represent portions located on the second surface (for example, the upper surface) of the PCB.

According to various embodiments, a null area (for example, the first area 305 in FIG. 3A) may be formed, based on that at least portions of the first part 711 and the second part 713 wound in different directions overlap each other. According to various embodiments, a detection area (for example, the second area 305 in FIG. 3A) may be formed, based on that at least portions of the first part 711 and the second part 713 wound in different directions do not overlap each other.

Referring to (b) in FIG. 7, according to various embodiments, multiple sub coils may be alternately arranged on the same PCB. Referring to (b) in FIG. 7, the second sub coil 730 and the third sub coil 750 may be arranged adjacent to the first sub coil 710. The adjacent second sub coil 730 may be disposed so that the first part 731 wound in the counterclockwise direction is positioned on the second surface (for example, the upper surface) and the second part 733 wound in the clockwise direction is positioned on the first surface (for example, the lower surface). The adjacent third sub coil 750 may be disposed so that the first part 751 wound in the counterclockwise direction is positioned on the second surface (for example, the upper surface) and the second part 753 wound in the clockwise direction is positioned on the first surface (for example, the lower surface).

According to various embodiments, when viewed from one direction (for example, the front direction of the sub coils 710, 730, and 750), the detection area of the first sub coil 710 may at least partially overlap the detection area of the second sub coil 730 and/or the detection area of the third sub coil 750. As described above with reference to FIG. 6, the accuracy of foreign object detection (FOD) through the overlapping detection areas may increase, based on the detection areas formed by the parts wound in the same direction overlap each other.

According to various embodiments, when viewed from one direction (for example, the front direction of the sub coils 710, 730, and 750), the first sub coil 710, the second sub coil 730, and the third sub coil 750 may be arranged so that the parts wound in different directions thereof do not overlap each other. For example, the first part 711 of the first sub coil 710 wound in the counterclockwise direction may not overlap the second part 733 of the adjacent second sub coil 730 wound in the clockwise direction and the second part 753 of the adjacent third sub coil 750 wound in the clockwise direction. The second part 713 of the first sub coil 710 wound in the clockwise direction may not overlap the first part 731 of the adjacent second sub coil 730 wound in the counterclockwise direction and the first part 751 of the adjacent third sub coil 750 wound in the counterclockwise direction.

Figure 8A:
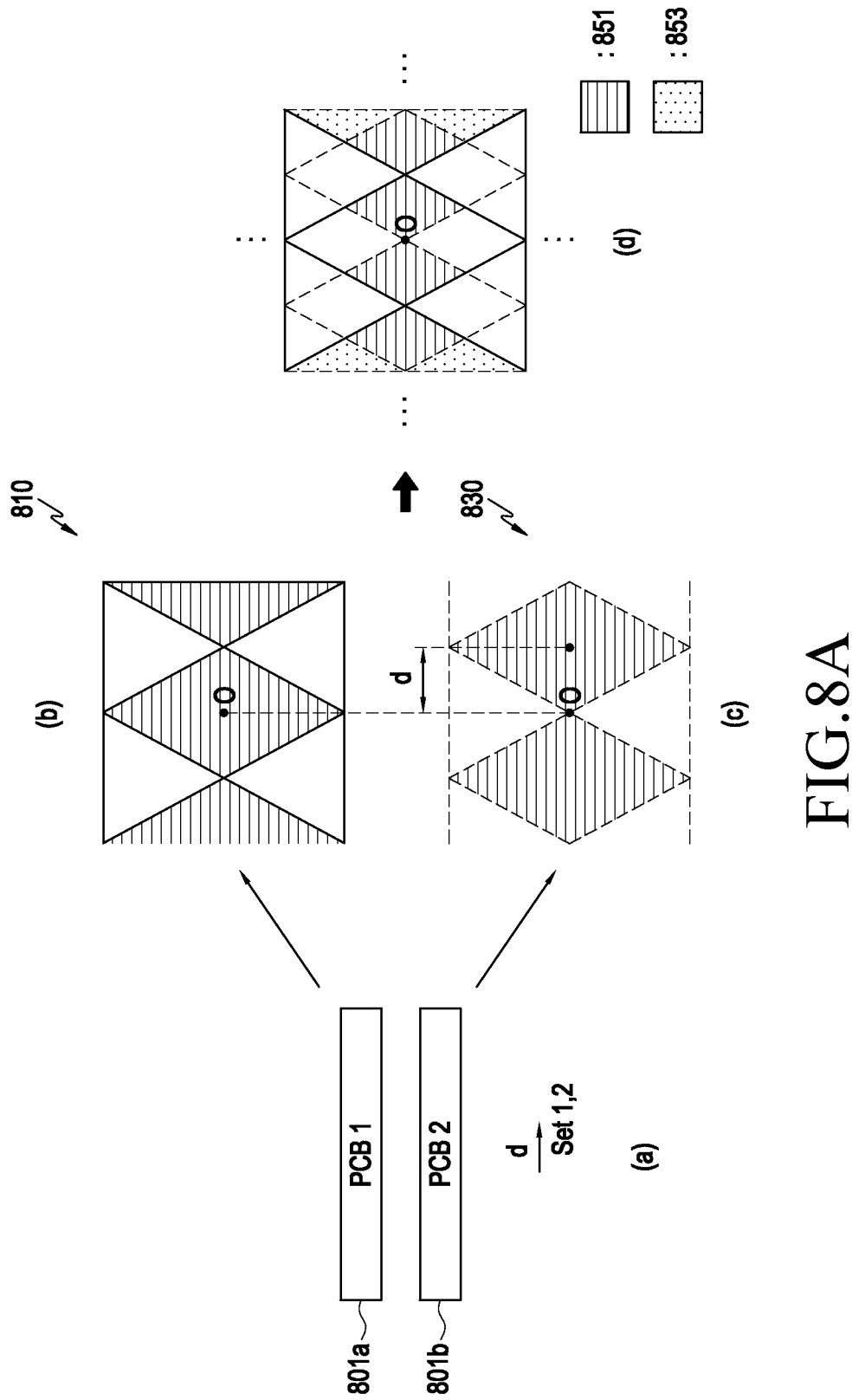
FIG. 8A is a diagram illustrating an example of arrangement of multiple detection coils according to various embodiments.
Figure 8B:
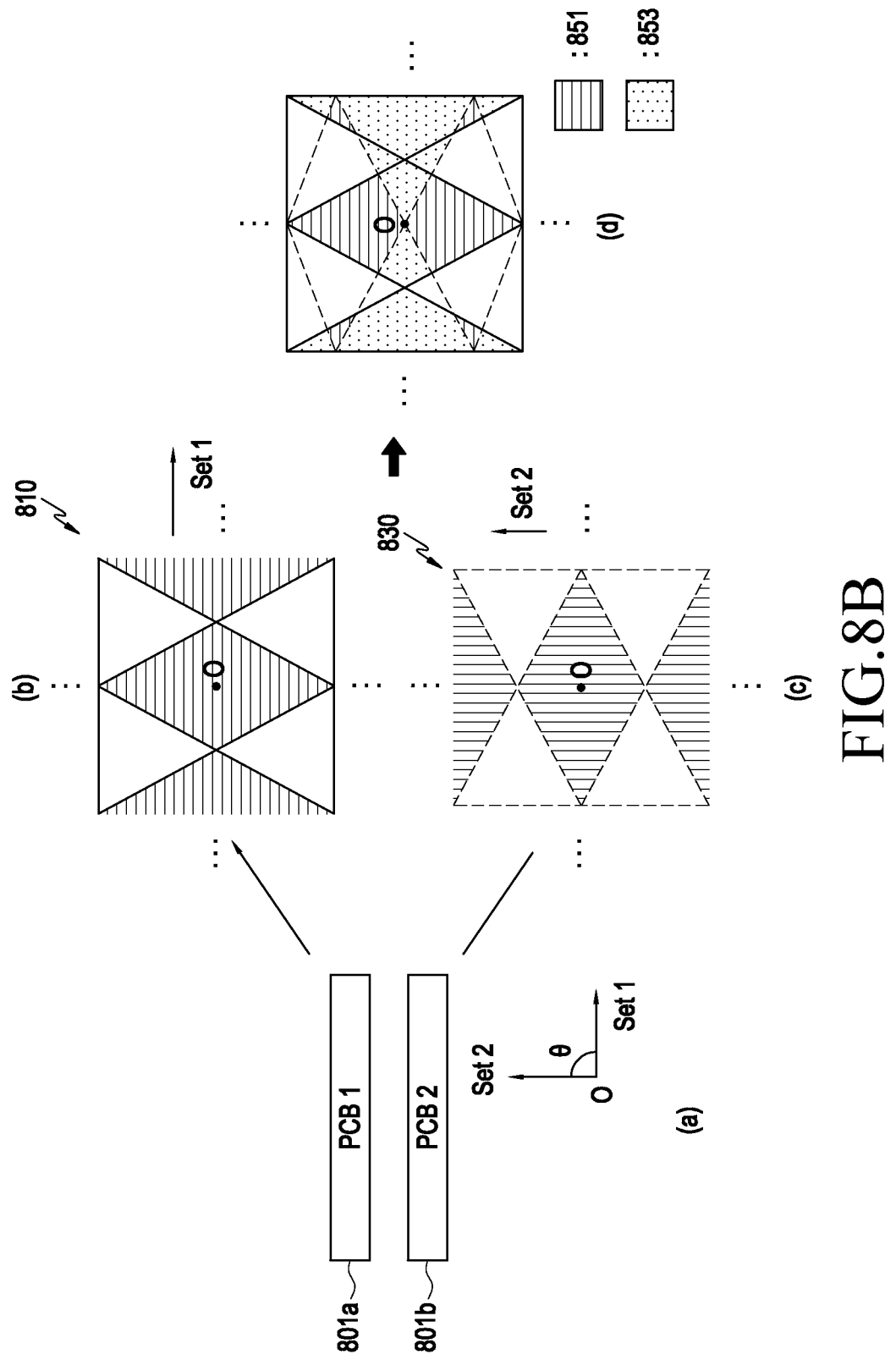
FIG. 8B is a diagram illustrating another example of arrangement of multiple detection coils according to various embodiments.

FIG. 8A is a diagram illustrating an example of arrangement of multiple detection coils 810 and 830 according to various embodiments. FIG. 8B is a diagram illustrating another example of arrangement of multiple detection coils 810 and 830 according to various embodiments.

According to various embodiments, a wireless power transmitter (for example, the wireless power transmitter 200 in FIG. 2) may include two or more detection coils (for example, the detection coil 100 in FIG. 2). According to various embodiments, the wireless power transmitter 200 may include a first detection coil 810 and a second detection coil 830. Referring to (a) in FIG. 8A or (a) in FIG. 8B, according to various embodiments, the first detection coil 810 may be disposed on at least one surface of a first PCB 801a and the second detection coil 830 may be disposed on at least one surface of a second PCB 801b located below the first PCB 801a. For example, each of parts (for example, the parts wound in the clockwise direction or the counterclockwise direction) constituting the first detection coil 810 and the second detection coil 830 may be alternately arranged, as described above with reference to FIG. 6, on the first and second surfaces (for example, the lower surface and the upper surface) of the first PCB 801a or the first and second surfaces (for example, the lower surface and the upper surface) of the second PCB 801b.

Referring to (b) and (c) in FIG. 8A and (b) and (c) in FIG. 8B, the parts indicated by the "solid line" represent parts arranged on at least one surface of the first PCB 801a and the parts indicated by the "dotted line" represent parts arranged on at least one surface of the second PCB 801b. The areas indicated by the "oblique line" represent null areas (for example, the first area 305 in FIG. 3A) in each detection coil 810 and 830. Even a foreign object (for example, the foreign object 2 in FIG. 1A) disposed on the null area (for example, the first area 305 in FIG. 3A), induced voltages (for example, induced voltage change) are offset and thus the induced voltages may not be detected on the null area.

According to various embodiments, the first sub coil 810 and the second sub coil 830 may be arranged to have a difference therebetween by a predetermined distance. For example, referring to (b) and (c) in FIG. 8A, when viewed from one direction (for example, the front direction of the first detection coil 810 and the second detection coil 830), the second detection coil 830 may be disposed to have a difference by a distance d in a direction (for example, the row direction (→)) perpendicular to the one direction (for example, the front direction) with reference to one point O. According to an embodiment, when viewed from one direction (for example, the front direction of the first detection coil 810 and the second detection coil 830), the second detection coil 830 may be disposed to have a difference by a distance in a direction (for example, the front direction) parallel with the one direction (for example, the front direction) with reference to one point O. According to an embodiment, when viewed from one direction (for example, the front direction of the first detection coil 810 and the second detection coil 830), the second detection coil 830 may be disposed to have a difference by a first distance in a direction (for example, the row direction (→)) perpendicular to the one direction (for example, the front direction) and a second distance in a direction (for example, the front direction) parallel with the one direction (for example, the front direction) with reference to one point O.

According to various embodiments, the first sub coil 810 and the second sub coil 830 may be arranged to have a difference therebetween by a predetermined angle. For example, referring to (b) and (c) in FIG. 8B, when viewed from one direction (for example, the front direction of the first detection coil 810 and the second detection coil 830), the second detection coil 830 may be disposed to have a difference by an angle θ with reference to one point O.

According to various embodiments, at least a portion of the null area (for example, the oblique lined area) may be offset, based on that the first sub coil 810 and the second sub coil 830 are arranged to have a difference therebetween by a predetermined distance d and/or a predetermined angle θ. For example, referring to (d) in FIG. 8A or (d) in FIG. 8B, when viewed from one direction (for example, the front direction of the first detection coil 810 and the second detection coil 830), the detection area (for example, the area without oblique lines) of the second detection coil 830 may be disposed under a portion of the null area (for example, the oblique lined area) of the first detection coil 810. As the detection area (for example, the area without oblique lines) of the second detection coil 830 may be disposed under a portion of the null area (for example, the oblique lined area) of the first detection coil 810, when a foreign object 2 is disposed on a portion of the null area (for example, the oblique lined area) of the first detection coil 810, an induced voltage change may be detected through the second detection coil 830, and accordingly, the presence of the foreign object 2 disposed on the portion of the null area (for example, the oblique lined area) of the first detection coil 810 may be identified. For example, referring to (d) in FIG. 8A or (d) in 8B, the areas 853 marked with "dots" represent areas changed so that the presence of the foreign object 2 can be detected by including the second detection coil 830 from among the areas (for example, (b) in FIG. 8A or (b) in FIG. 8B) in which the presence of the foreign object 2 is not identified when only the first detection coil 810 is included. In other words, the area (for example, area other than the areas indicated by reference numeral 851) in which the foreign object detection (FOD) is possible when using the first and second detection coils 810 and 830 is larger, by the area indicated by reference numeral 853, than the area (for example, area other than the oblique lined area in (b) in FIG. 8A or (b) in FIG. 8B) in which the foreign object detection (FOD) is possible when using only the first detection coil 810.

Figure 9:
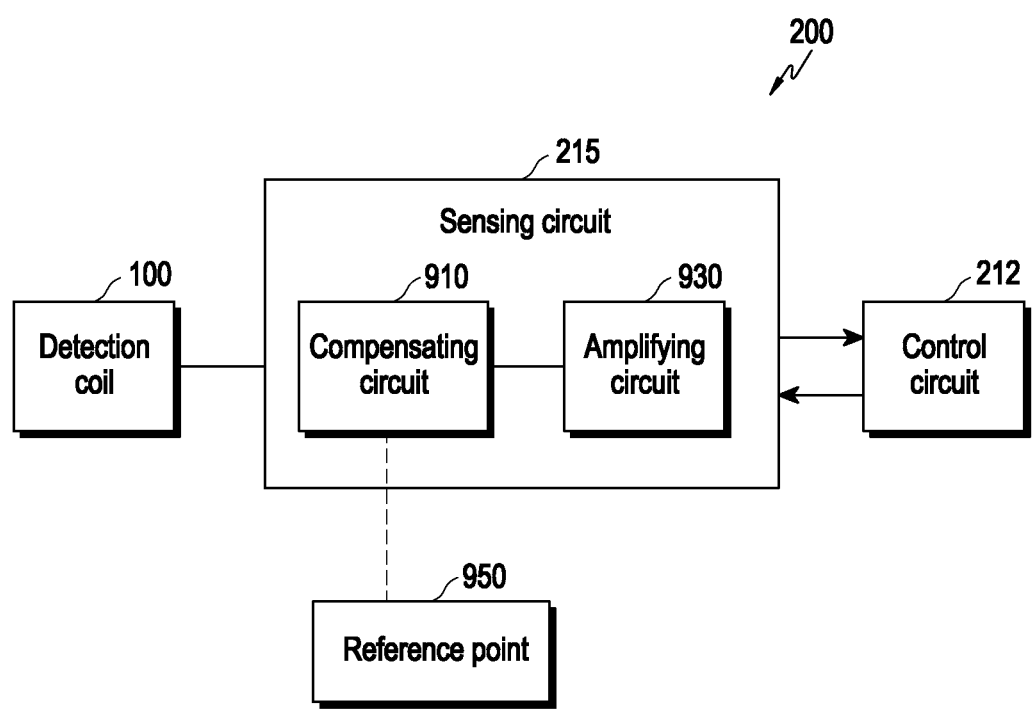
FIG. 9 is a block diagram illustrating components of a wireless power transmitter according to various embodiments.

FIG. 9 is a block diagram illustrating components of a wireless power transmitter 200 according to various embodiments.

According to various embodiments, a power adapter (for example, the power adapter 221 in FIG. 2) of a high-end wireless power transmitter may include a power factor correction (PFC) circuit, whereas a power adapter 221 of a low-end wireless power transmitter may not include a PFC circuit but include a filter capacitor. A low-end wireless power transmitter does not include a PFC circuit, and therefore there may be a fluctuation on a magnetic field generated from a transmitting coil (for example, the conductive pattern 224 in FIG. 2) according to a fluctuation of an external power source (for example, system power source), a fluctuation in an input voltage of an inverter (for example, the power producing circuit 222), and/or an operation of an inverter (for example, the power producing circuit 222 in FIG. 2). For example, a fluctuation may occur in an alternating current voltage input to a filter capacitor (for example, the power adapter 221) from a system power source. For example, a total harmonic distortion (THD) may occur in a voltage output from a filter capacitor (for example, the power adapter 221) input to an inverter (for example, the power producing circuit 222). As a result, a size of a voltage input to a transmitting coil (for example, the conductive pattern 224) may be fluctuated. For example, according to whether a wireless power transmitter is in a mode before transmitting output power (for example, a pre-power mode) or in a mode transmitting output power (for example, a during-power mode), or an amount of output power being transmitted, the control circuit 212 may adjust an operating frequency (for example, a switching frequency) of an inverter (for example, the power producing circuit 222), and a frequency of a current input to a transmitting coil (for example, the conductive pattern 224) may fluctuate. Due to the causes described above, as a size and/or frequency of a current (for example, a Tx current) input to a transmitting coil (for example, the conductive pattern 224) fluctuates, a size and/or frequency of a magnetic field generated from a transmitting coil (for example, the conductive pattern 224) fluctuates and a fluctuation in an induced voltage of the detection coil 100 may occur regardless of the presence of a foreign object (FO).

Hereinafter, the description will be given of operations of a low-end wireless power transmitter including not a PFC circuit but a filter capacitor as the power adapter 221.

According to various embodiments, the wireless power transmitter 200 may include a detection coil 100, a sensing circuit 215, and/or a control circuit 212. According to various embodiments, the sensing circuit 215 may include a compensating circuit 910 and/or an amplifying circuit 930.

According to various embodiments, the sensing circuit 215 may sense a voltage (for example, an induced voltage) of the detection coil 100. According to various embodiments, the sensing circuit 215 may output a value based on the sensed voltage (for example, an induced voltage) to the control circuit 212.

According to various embodiments, the compensating circuit 910 may compensate, based on a value of a reference point 950, the voltage (for example, an induced voltage) of the detection coil 100. For example, the reference point 950 may include at least one of an input terminal of a portion of the detection coil 100, an input terminal (for example, an output terminal of a filter capacitor (for example, the power adapter 221) or an output terminal of the control circuit 212 (or a pulse width modulation (PWM) circuit)) of an inverter (for example, the power producing circuit 222), or an output terminal (for example, an input terminal of the detection coil 100) of an inverter (for example, the power producing circuit 222).

According to an embodiment, the compensating circuit 910 may compensate, based on the sensed voltage at the output terminal of a portion of the detection coil 100, a voltage (for example, an induced voltage) of the detection coil 100. For example, the detection coil 100 may include first sub coils connected to each other in series and second sub coils connected to each other in series. By way of example, the first sub coils may be sub coils located on a first part (for example, in inner part) of a coverage area (for example, the coverage area 501 in FIG. 5), and the second sub coils may be sub coils located on a second part (for example, a peripheral area of the first part) of the coverage area 501. The compensating circuit 910 may receive a voltage (for example, an induced voltage) corresponding to the second sub coils as a value of a second channel and a voltage (for example, an induced voltage) corresponding to the first sub coils as a value of a first channel. The compensating circuit 910 may compensate the value (for example, the induced voltage sensed from the first sub coils) of the first channel, based on the value (for example, the induced voltage sensed from the second sub coils) of the second channel.

According to an embodiment, the compensating circuit 910 may compensate the voltage (for example, an induced voltage) of the detection coil 100, based on the value sensed at an input terminal (for example, an output terminal of a filter capacitor (for example, the power adapter 221) or an output terminal of the control circuit 212) of an inverter (for example, the power producing circuit 222). For example, the compensating circuit 910 may receive the voltage (for example, a DC link voltage) sensed at an output terminal of the filter capacitor (for example, the power adapter 221) as a value of the second channel. The voltage at the output terminal of the filter capacitor (for example, the power adapter 221) may be sensed by a voltage sensor (for example, a voltage distributing circuit), and the compensating circuit 910 may receive the output value of the voltage sensor as a value of the second channel. For another example, the compensating circuit 910 may receive the voltage sensed at an output terminal of the control circuit 212 as a value of the second channel. More specifically, the control circuit 212 may include a PWM circuit or control the PWM circuit disposed outside the control circuit 212. The PWM circuit included in or disposed outside the control circuit 212 may be connected to an inverter (for example, the power producing circuit 222). The control circuit 212 may adjust a duty cycle of the PWM circuit to adjust the operating frequency of the inverter (for example, the power producing circuit 222). The compensating circuit 910 may receive an output voltage of the PWM circuit as a value of the second channel. A voltage (for example, an induced voltage) may be received as a voltage corresponding to at least a portion of the detection coil 100. The compensating circuit 910 may compensate, based on a value (for example, a DC link voltage or an output voltage of a PWM circuit) of the second channel, a value (for example, an induced voltage) of the first channel.

According to an embodiment, the compensating circuit 910 may compensate a voltage (for example, an induced voltage) of the detection coil 100, based on the value sensed at an output terminal (for example, an input terminal of the detection coil 100) of an inverter (for example, the power producing circuit 222). For example, the compensating circuit 910 may receive a current (for example, a Tx current) (or a Tx voltage) sensed at an input terminal of the detection coil 100 as a value of the second channel. For example, the current (for example, a Tx current) sensed at the input terminal of the detection coil 100 may be sensed by a current sensor (for example, a sensor resistance and/or hall sensor), and the compensating circuit 910 may receive an output value of the current sensor as a value of the second channel. The compensating circuit 910 may a voltage (for example, an induced voltage) corresponding to at least a portion of the detection coil 100 as a value of the first channel. The compensating circuit 910 may compensate, based on a value (for example, a Tx current) (or a Tx voltage) of the second channel, a value (for example, an induced voltage) of the first channel.

According to various embodiments, the compensating circuit 910 may normalize, based on the value of the reference point 950 described above, a voltage (for example, an induced voltage) of the detection coil 100 to compensate the voltage (for example, an induced voltage) of the detection coil 100, and the description thereof will be given in detail with reference to a drawing to be described below.

According to various embodiments, the compensating circuit 910 may compensate, based on a correction value received from the control circuit 212, a voltage (for example, an induced voltage) of the detection coil 100. For example, the control circuit 212 may input a predesignated correction value (for example, an offset value) to the compensating circuit 910, based on the presence or absence of a wireless power receiver (for example, the wireless power receiver 250 in FIG. 2), arrangement of the wireless power receiver 250, and/or an operation mode of the wireless power transmitter 200. The control circuit 212 may identify whether the wireless power receiver 250 is present on the wireless power transmitter 200 (for example, on a charging pad) by measuring an impedance of a transmitting coil (for example, the conductive pattern 224), and may input different correction values to the compensating circuit 910 according to whether the wireless power receiver 250 is present. The control circuit 212 may identify an alignment state of the wireless power receiver 250 with respect to a transmitting coil (for example, the conductive pattern 224) based in an impedance of the transmitting coil (for example, the conductive pattern 224) and power reception information (for example, a received power amount) of the wireless power receiver 250, and may input different correction values to the compensating circuit 910 according to the alignment state (for example, align or misalign) of the wireless power receiver 250. The control circuit 212 may input different correction values to the compensating circuit 910 according to whether the wireless power transmitter 200 is in a mode before transmitting output power (for example, a pre-power mode) or in a mode transmitting output power (for example, a during-power mode). The compensating circuit 910 may compensate (for example, apply offset), based on a correction value received from the control circuit 212, a voltage (for example, an induced voltage) of the detection coil 100. For example, the compensating circuit 910 may apply offset as much as a voltage corresponding to the received correction value to a voltage (for example, an induced voltage) of the detection coil 100. For example, the value to which offset is applied may be variable according to the correction value received from the control circuit 212 and may be preconfigured.

According to various embodiments, the amplifying circuit 930 may amplify a voltage output from the compensating circuit 910. For example, the amplifying circuit 930 may include at least one operational amplifier (OP-amp). For example, the amplifying circuit 930 may amplify an output voltage to an integer time (for example, five-fold) of the voltage of the compensating circuit 910.

According to various embodiments, the control circuit 212 may be implemented as a microprocessor (MCU) or a micro controlling unit, without limitation thereto. According to various embodiments, the control circuit 212 may be implemented to include an analog element. According to various embodiments, the control circuit 212 may determine whether to transmit wireless power through a conductive pattern (for example, the conductive pattern 224 in FIG. 2) and/or control to output notification through an output device, based on a value output from the sensing circuit 215 (for example, the amplifying circuit 930). According to various embodiments, the control circuit 212 may input a predesignated correction value to the compensating circuit 910, based on the presence or absence of a wireless power receiver 250, arrangement of the wireless power receiver 250, and/or an operation mode of the wireless power transmitter 200.

Figure 10A:
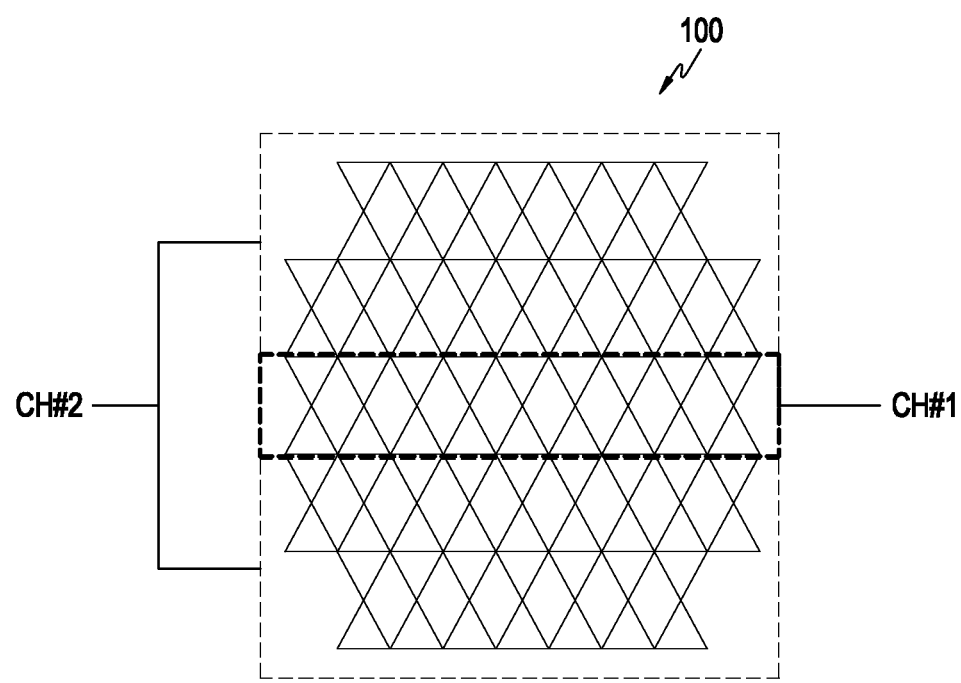
FIG. 10A illustrates an example of a method for configuring channels for induced voltage compensation according to various embodiments.
Figure 10B:
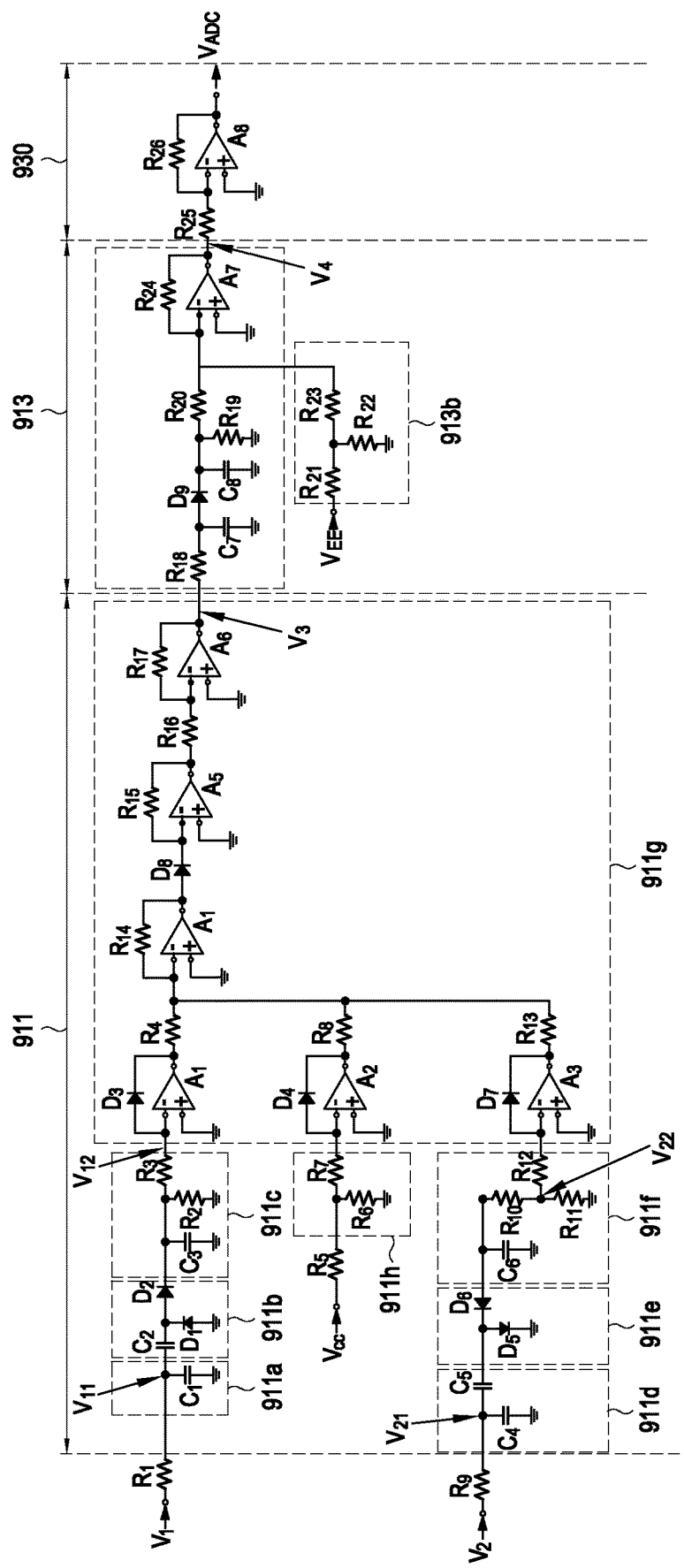
FIG. 10B illustrates an example of a sensing circuit 215 for induced voltage compensation according to various embodiments.

FIG. 10A illustrates an example of a method for configuring channels for induced voltage compensation according to various embodiments. FIG. 10B illustrates an example of a sensing circuit 215 for induced voltage compensation according to various embodiments.

Referring to FIG. 10A, a pattern of sub coils arranged on a coverage area (for example, the coverage area 501 in FIG. 5) is illustrated according to various embodiments. According to various embodiments, a portion of the detection coil 100 may be configured as the second channel. For example, among sub coils (for example, the sub coil 300 in FIG. 3A) of the detection coil 100, sub coils located in the inner part of the coverage area 501 may be configured as a first channel (for example, CH #1) and sub coils located in the outside part of the coverage area may be configured as a second channel (for example, CH #2). According to various embodiments, the sub coils configured as the same channel may be connected (for example, connected in series) to each other.

According to an embodiment, the filter capacitor (for example, the power adapter 221), the control circuit 212 (or the PWM circuit), or the inverter (for example, the power producing circuit 222) may be configured as the second channel (for example, CH #2). In this case, a portion or an entirety of the sub coils constituting the detection coil 100 may be configured as the first channel (for example, CH #1). According to an embodiment, two or more of portions of the detection coil 100, the filter capacitor (for example, the power adapter 221), the control circuit 212 (or the PWM circuit), or the inverter (for example, the power producing circuit 222) may be configured as the second channel.

Referring to FIG. 10B, a circuit diagram of the sensing circuit 215 according to various embodiments is illustrated.

According to various embodiments, the sensing circuit 215 may include a first compensating circuit 911 (for example, the compensating circuit 910 in FIG. 9), a second compensating circuit 913 (for example, the compensating circuit 910 in FIG. 9), and/or an amplifying circuit 930. Hereinafter, an embodiment in which a portion of the detection coil 100 is configured as the second channel (for example, CH #2) will be described.

According to various embodiments, the first compensating circuit 911 may receive a voltage (for example, an induced voltage V1 of the first channel (for example, CH #1 in FIG. 10A)) of the detection coil 100 and compensate, based on a reference point value (for example, an induced voltage V2 of the second channel (for example, CH #2 in FIG. 10A)), the received voltage (for example, the induced voltage V1 of the first channel).

According to various embodiments, the first compensating circuit 911 may include an RC circuit 911*a* and 911*d* (for example, a lowpass filter, LPF), a multiplier 911*b* and 911*e*, a peak detector 911*c* and 911*f*, and a normalizing circuit 911*g*. The peak detector 911*f* may include a voltage distributor including at least one resistance R10 and R11. The first compensating circuit 911 may further include a dummy load 911*h*, and the dummy load 911*h* may be implemented as a voltage distributor including at least one resistance. By way of example, the resistance R1, R9, and R18 may be configured to have 1 kΩ, the resistance R5 and R21 to have 200 kΩ, the resistance R26 to have 510 kΩ, and the other resistances to have 100 kΩ. The capacitor C1, C4, and C7 may be configured to have 1 nF, the capacitor C2 and C5 to have 10 nF, and the capacitor C3, C6, and C8 to have 100 nF. The diodes D1 to D9 may be implemented as Schottky diodes.

According to various embodiments, when a first voltage (for example, an induced voltage V1) of the first channel CH #1 is applied to the RC filter 911a, a filtered voltage V11 may be output. According to various embodiments, the output voltage V12 of the peak detector 911c may be input to the normalizing circuit 911g. For example, the output voltage V12 may have, when elements of the circuit diagram have elements values according to the described embodiment, a magnitude of 2V11.

According to various embodiments, when Vcc is applied to the dummy load 911h, a voltage Vd may be output and input to the normalizing circuit 911g. According to various embodiments, the voltage Vd may be 1V, Vcc having a magnitude for causing 1V voltage to be input to the normalizing circuit 911g may be applied to the dummy load 911h. According to various embodiments, when a second voltage (for example, an induced voltage V2) of the second channel CH #2 is applied to the RC circuit 911d (for example, an RC filter), a filtered voltage V21 may be output. According to various embodiments, the output voltage V22 of the peak detector 911f may be input to the normalizing circuit 911g. For example, the output voltage V22 may be obtained through Equation 7. "a" may have, when elements of the circuit diagram have elements values according to the described embodiment, a value of 2.

$$V_{22} = \left\{ \frac{R_{11} // R_{12}}{R_{10} + (R_{11} // R_{12})} \right\} \times (a \cdot V_{21}) \quad \text{Equation 7}$$

According to various embodiments, voltages (for example, $V_{12}$, $V_d$, and $V_{22}$) may be input to the normalizing circuit 911g. According to various embodiments, the output voltage $V_3$ of the normalizing circuit 911g may be input to the second compensating circuit 913. For example, the output voltage $V_3$ may be obtained through Equation 8.

$$V_3 = \frac{V_{12}}{V_{22}} = \frac{V_1}{V_2} \quad \text{Equation 8}$$

According to various embodiments, the output voltage V3 of the normalizing circuit 911g is a ratio of values calculated from the voltages (for example, induced voltages) of two channels, and therefore may have values irrelevant to a fluctuation of a current (for example, a Tx current) (for example, values not being affected by a fluctuation of a TX current) input to a transmitting coil (for example, the conductive pattern 224 in FIG. 2). For example, the output voltage V3 may have values which is not affected by a fluctuation of an external power source (for example, a system power source), a fluctuation in an input voltage of an inverter (for example, the power producing circuit 222 in FIG. 2), and/or an operation of an inverter (for example, the power producing circuit 222).

According to various embodiments, the second compensating circuit 913 may receive, from the first compensating circuit 911, a voltage value (for example, V3) with respect to a ratio of a voltage value (for example, an induced voltage V1) of the first channel CH #1 and a voltage value (for example, an induced voltage V2), and may compensate a voltage value (for example, V3) with respect to the received ratio, based on a correction value (for example, VEE) input from the control circuit 212.

According to various embodiments, the second compensating circuit 913 may include a negative offset circuit 913a and a negative voltage selector 913b. According to various embodiments, the negative voltage selector 913b may input, to the negative offset circuit 913a, a voltage −Vneg corresponding to a correction value VEE input from a control circuit (for example, the control circuit 212 in FIG. 2). For example, the control circuit 212 may include a PWM circuit or control the PWM circuit disposed outside the control circuit 212. The negative voltage selector 913b may include an RC filter and an OP-amp. The PWM circuit included in or disposed outside the control circuit 212 may be connected to the negative voltage selector through at least one input/output terminal (for example, a general-purpose input/output, GPIO). The control circuit 212 may input a PWM output (for example, an output corresponding to 50% of a duty cycle) to the negative voltage selector 913b by using the PWM circuit. The RC filter of the negative voltage selector 913b may output a voltage (for example, a DC voltage) having a magnitude corresponding to the PWM output, and the output voltage (for example, a DC voltage) may be converted by the OP-amp of the negative voltage selector 913b and input to the negative offset circuit 913a. Through this, for example, a negative voltage −Vneg included in a range of 0 V to 3.3 V may be input from the negative voltage selector 913b to the negative offset circuit 913a. According to various embodiments, the second compensating circuit 913 may apply, based on the negative voltage −Vneg, offset to the input output voltage V3 and output the offset-applied voltage V4. For example, the offset-applied voltage V4 may be obtained through Equation 9.

$$V_4 = V_3 - V_{neg} \quad \text{Equation 9}$$

According to various embodiments, the amplifying circuit 930 may amplify a value (for example, $V_4$) based on a ratio, output from the compensating circuit 910 (for example, the second compensating circuit 913), of a voltage value (for example, an induced voltage $V_1$) of the first channel CH #1 and a voltage value (for example, an induced voltage $V_2$) to output the amplified voltage value (for example, $V_{ADC}$) to the control circuit 212 (for example, an ADC of the control circuit 212). For example, the amplifying circuit 930 may include at least one OP-amp (for example, $A_8$), and when a gain of the OP-amp (for example, $A_8$) is GA, an output voltage $V_{ADC}$ of the amplifying circuit 930 may be obtained through Equation 10. Equation 10 is obtained on the assumption that R25 and R26 have the same element value.

$$V_{ADC} = (V_3 - V_{neg}) \times G_A = \left(\frac{V_1}{V_2} - V_{neg}\right) \times G_A \quad \text{Equation 10}$$

According to various embodiments, $V_{ADC}$ in Equation 10 may have element values of elements of a circuit diagram and a preconfigured voltage value based on a negative voltage Vneg.

According to various embodiments, when a foreign object (for example, the foreign object 2 in FIG. 1A) is disposed on (or around) an area corresponding to the first channel CH #1, a fluctuation ΔV1 may occur on a voltage (for example, induced voltage V1) of the first channel CH #1, and an output value of the sensing circuit 215 (for example, the amplifying circuit 930) may be obtained through Equation 11.

$$V'_{ADC} = \left(\frac{V_1 + \Delta V_1}{V_2} - V_{neg}\right) \times G_A \qquad \text{Equation 11}$$

According to various embodiments, the control circuit 212 may identify the presence of a foreign object 2, based on a difference between a value (for example, VADC in Equation 10) (in other words, a threshold value) preconfigured before the foreign object 2 is disposed and an output value (for example, V'ADC in Equation 11) of the sensing circuit 215 (for example, the amplifying circuit 930). For example, the control circuit 212 may monitor the sensing circuit 215 (for example, the amplifying circuit 930) and when a value other than the preconfigured value (for example, VADC) is output from the sensing circuit 215 (for example, the amplifying circuit 930) and/or a value of which a difference from the preconfigured value (for example, VADC) is larger than or equal to a designated magnitude is output from the sensing circuit 215 (for example, the amplifying circuit 930), may identify that the foreign object 2 is present on (or around) the detection coil (for example, the detection coil 100 in FIG. 2). When the presence of the foreign object 2 is identified, the control circuit 212 may not initiate an operation of wirelessly transmitting power to the wireless power receiver 250, and/or stop the operation of wirelessly transmitting power to the wireless power receiver 250. The control circuit 212 may output a notification (for example, an alarm sound) through an output device (for example, a speaker) of the wireless power transmitter 200, and/or control the wireless power receiver 250 to output a notification (for example, an alarm sound) through an output device (for example, a speaker). According to various embodiments, when a value of which a difference from the preconfigured value (for example, VADC) falls within an error range (for example, a difference less than a designated magnitude (for example, 200 mV)) is output from the sensing circuit 215, the control circuit 212 may identify that the foreign object 2 is not present on (or around) the detection coil (for example, the detection coil 100 in FIG. 2). When the presence of the foreign object 2 is not identified, the control circuit 212 may initiate an operation of wirelessly transmitting power to the wireless power receiver 250, and/or maintain the operation of wirelessly transmitting power to the wireless power receiver 250.

According to an embodiment, a value (for example, a second voltage) of the second channel CH #2 input to the RC circuit 911*d* may be replaced by a value (for example, a DC ling voltage or an output voltage of a PWM circuit) sensed at an input terminal (for example, an output terminal of a filter capacitor (for example, the power adapter 221) or an output terminal of the control circuit 212) of an inverter (for example, the power producing circuit 222). In this case, the RC circuit 911*d* may be replaced by a high pass filter. According to an embodiment, a value (for example, a second voltage) of the second channel CH #2 input to the RC circuit 911*d* may be replaced by a value (for example, a Tx current or Tx voltage) sensed at an output terminal (for example, an input terminal of the detection coil 100) of an inverter (for example, the power producing circuit 222).

According to an embodiment, multiple values of the second channel CH #2 may be configured. For example, each second channel may include corresponding elements (for example, 911*d*, 911*e*, 911*f*, 911*g*, A2, and A3) and one of a voltage value of an output terminal of the filter capacitor (for example, the power adapter 221), a voltage value of an output terminal of the control circuit 212, or a current value of an input terminal of the detection coil 100 may be input as a value for each second channel (for example, a value of an input terminal of the RC circuit corresponding to each second channel).

Figure 11:
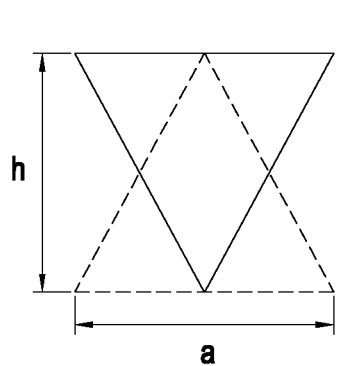
FIG. 11 illustrates an example of a sub coil included in a detection coil according to various embodiments.
Figure 11:
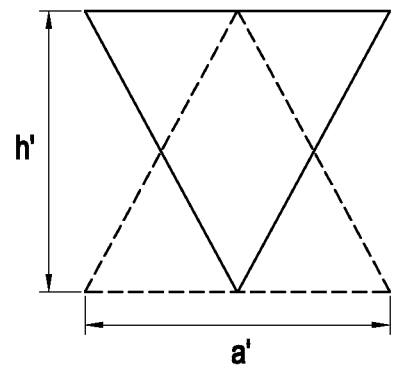

FIG. 11 illustrates an example of a sub coil included in a detection coil according to various embodiments. According to an embodiment, the detection coil may have a stacking structure of multiple detection coils (for example, the detection coil 100 in FIG. 1), and each of the multiple detection coils may include sub coils (for example, the sub coil 300 in FIG. 3A) having sizes different from each other. FIG. 11A and FIG. 11B may show sub coils included in the multiple detection coils.

Referring to FIG. 11A, according to various embodiments, a sub coil (for example, the sub coil 300 in FIG. 3A) may include a first part (for example, the first part 301 in FIG. 3A) of a regular triangle having a width (for example, a length in x-axis direction) of a, and a length (or height) (for example, a length in y-axis direction) of h, and a second part (for example, the second part 303 in FIG. 3A) of an inverted triangle.

Referring to FIG. 11B, according to various embodiments, a sub coil (for example, the sub coil 300 in FIG. 3A) may include a first part (for example, the first part 301 in FIG. 3A) of a regular triangle having a width (for example, a length in x axis direction) of a', and a length (or height) (for example, a length in y-axis direction) of h', and a second part (for example, the second part 303 in FIG. 3A) of an inverted triangle. According to an embodiment, the width a' of the sub coil shown in FIG. 11B may be longer than the width a of the sub coil shown in FIG. 11A, and the length h' of the sub coil shown in FIG. 11B may be longer than the length h of the sub coil shown in FIG. 11A.

According to an embodiment, FIG. 11A and FIG. 11B show that the sub coils have triangular shapes, but the shapes are not limited thereto and may be polygonal shapes or circular shapes.

Figure 12:
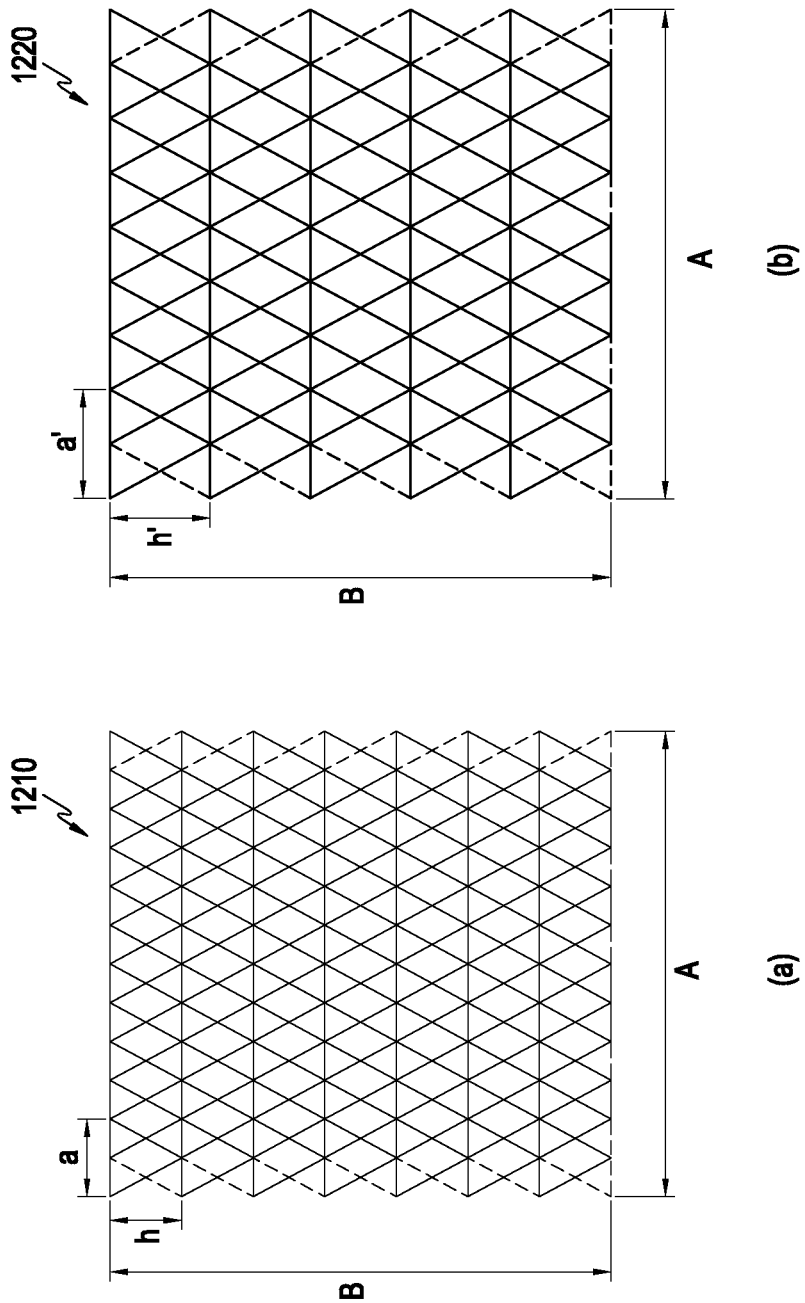
FIG. 12 illustrates an example of a detection coil including the sub coil in FIG. 11 according to various embodiments.

FIG. 12 illustrates an example of a detection coil including the sub coil in FIG. 11 according to various embodiments. According to an embodiment, FIG. 12A may show a detection coil (for example, the detection coil 100 in FIG. 1B) including the sub coil (for example, the sub coil 300 in FIG. 3A) shown in FIG. 11A, and FIG. 12B may show a detection coil (for example, the detection coil 100 in FIG. 1B) including the sub coil (for example, the sub coil 300 in FIG. 3A) shown in FIG. 11B.

Referring to FIG. 12A, according to various embodiments, the detection coil 1210 (for example, the detection coil 100 in FIG. 1B) may have a width (for example, a length in X-axis direction) of A, and a length (or height) (for example, a length in y-axis direction) of B. According to an embodiment, the detection coil 1210 may include the sub coil (for example, the sub coil 300 in FIG. 3A) shown in FIG. 11A, including a first part (for example, the first part 301 in FIG. 3A) of a regular triangle having a width (for example, a length in x-axis direction) of a, and a length (or height) (for example, a length in y-axis direction) of h, and a second part (for example, the second part 303 in FIG. 3A) of an inverted triangle.

Referring to FIG. 12B, according to various embodiments, the detection coil 1220 (for example, the detection coil 100 in FIG. 1B) may have a width (for example, a length in X-axis direction) of A, and a length (or height) (for example, a length in y-axis direction) of B. According to an embodiment, the detection coil 1220 may include the sub coil (for example, the sub coil 300 in FIG. 3A) shown in FIG. 11B, including a first part (for example, the first part 301 in FIG. 3A) of a regular triangle having a width (for example, a length in x-axis direction) of a', and a length (or height) (for example, a length in y-axis direction) of h', and a second part (for example, the second part 303 in FIG. 3A) of an inverted triangle.

According to an embodiment, when the detection coil 1210 shown in FIG. 12A and the detection coil 1220 shown in FIG. 12B have the same width and the same length, the number of sub coils included therein may be different. For example, the width and the length of the sub coil included in the detection coil 1210 shown in FIG. 12A are smaller than those of the sub coil included in the detection coil 1220 shown in FIG. 12B, and therefore, the number of the sub coils included in the detection coil 1210 shown in FIG. 12A may be larger than that of the sub coil included in the detection coil 1220 shown in FIG. 12B.

Figure 13:
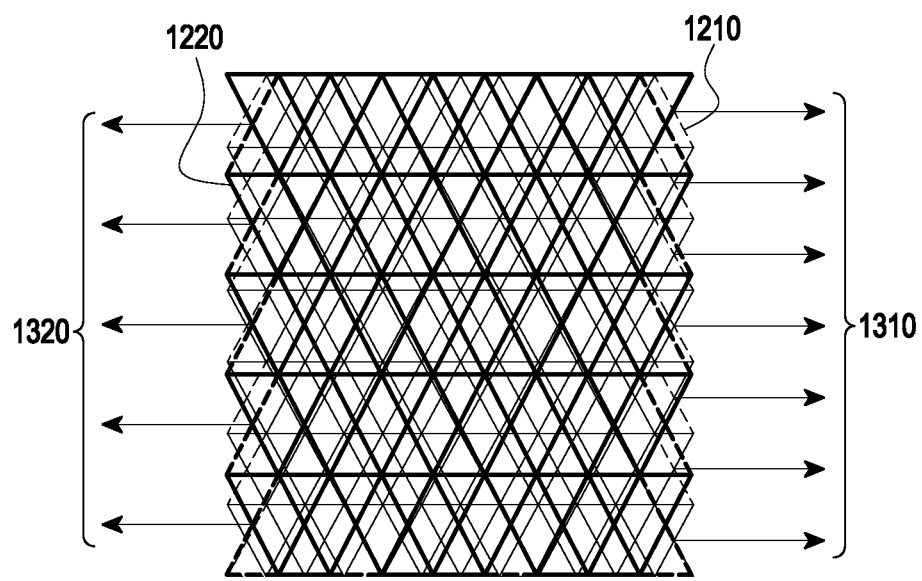
FIG. 13 illustrates an example of a stacked structure of a detection coil according to various embodiments.

FIG. 13 illustrates an example of a stacked structure of a detection coil according to various embodiments. For example, FIG. 13 may show a structure in which the detection coil 1210 (hereinafter, the first detection coil 1210) shown in FIG. 12A and the detection coil 1220 (hereinafter the second detection coil 1220) shown in FIG. 12B are vertically staked on each other without parallel movement or rotation.

According to an embodiment, referring to FIG. 13, in the stacking structure, a null line 1310 of the first detection coil 1210 and a null line 1320 of the second detection coil 1220 have different numbers and do not overlap each other. For example, the null line may be a line connecting the centers of null areas in which an induced voltage fluctuation may not be detected as the induced voltages generated at each part are offset due to the sub coil including parts wound in different directions (for example, the parts 301 and 303 in FIG. 3A).

As such, the vertical staking of the first detection coil 1210 and the second detection coil 1220 without parallel movement or rotation may reduce an unnecessary detection coil area and reduce a difference between induced voltages of two detection coils to prevent circuit saturation.

According to various embodiments, when staking the first detection coil 1210 and the second detection coil 1220 including unit coils of different sizes, the null lines of each detection coil do not overlap and therefore, the null area incapable of detecting an induced voltage fluctuation may be removed.

In addition, according to various embodiments, the removal of the null area may increase a signal to noise ratio of an induced voltage fluctuation through signal amplifying and reduce complexity of a post-processing circuit.

Figure 14:
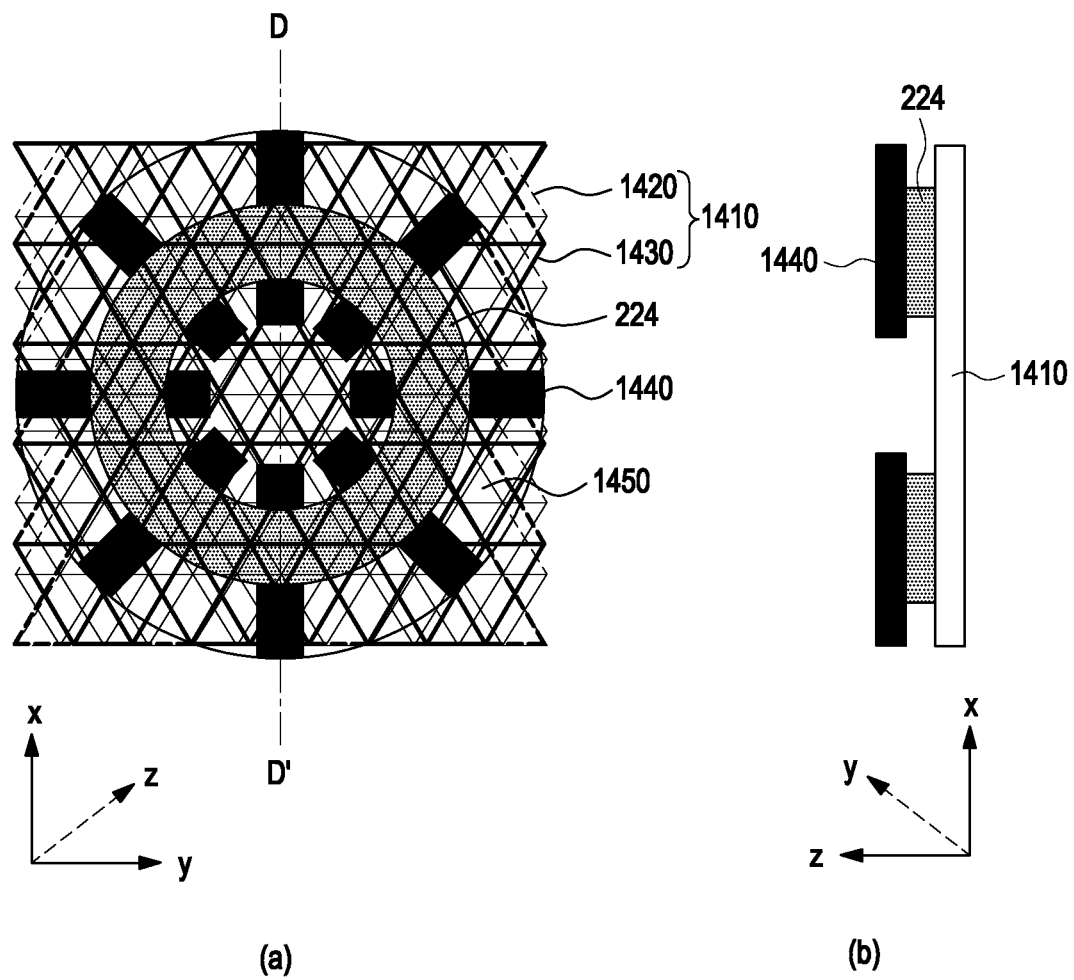
FIG. 14 is a diagram illustrating arrangement of a detection coil according to various embodiments.

FIG. 14 is a diagram illustrating arrangement of a detection coil according to various embodiments. For example, FIG. 14 is a diagram illustrating a detection coil disposed on a symmetrical conductive pattern (for example, a circular coil). For example, FIG. 14A shows disposition of a detection coil in x-y surface, and FIG. 14B shows a cross-sectional view taken along D-D' of FIG. 14A.

Referring to FIG. 14A and FIG. 14B, the detection coil 1410 (for example, the detection coil 100 in FIG. 1B) may include a first detection coil 1420 and a second detection coil 1430 including sub coils of different sizes, and the first detection coil 1420 and the second detection coil 1430 may be vertically stacked on each other without parallel movement or rotation.

According to an embodiment, the detection coil 1410 may be disposed to cover the conductive pattern 224. For example, the detection coil 1410 may be disposed to exceed the area of the conductive pattern 224 with reference to x-y surface. For example, based on that the conductive pattern 224 have a symmetrical shape, the detection coil 1410 may have the same width and length.

According to an embodiment, each of the first detection coil 1420 and the second detection coil 1430 included in the detection coil 1410 may be disposed symmetrical with respect to the center of the conductive pattern 224.

According to an embodiment, the ferrite 1440, the conductive pattern 224, and the detection coil 1410 may be sequentially arranged. According to an embodiment, a shielding structure 1450 may be further included, and the shielding structure 1450 may be disposed at one side of the ferrite 1440. For example, the shielding structure 1450 may be disposed on one surface of the ferrite 1440 opposite to the surface on which the conductive pattern 224 is disposed.

As such, as the first detection coil and the second detection coil including unit coils of different sizes, the null lines of each detection coil do not overlap each other and thus the null area incapable of detecting an induced voltage fluctuation can be removed, and each detection is symmetric with respect to the center of the conductive pattern and thus the effect of the characteristics of the power transmitter or receiver and the arrangement environment can be reduced.

Figure 15:
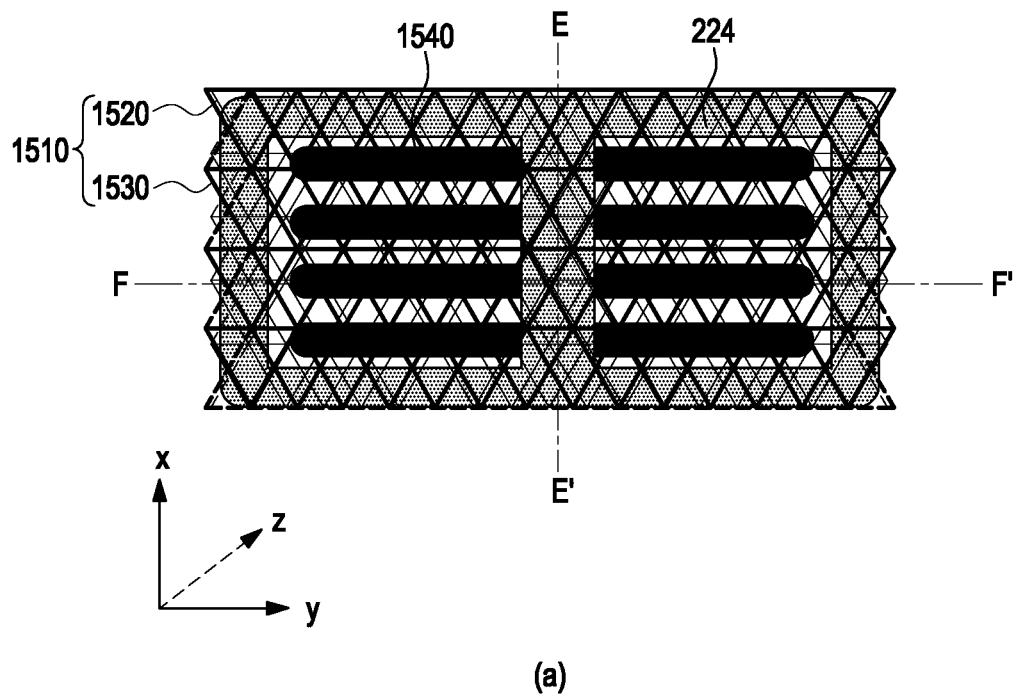
FIG. 15 is a diagram illustrating arrangement of a detection coil according to various embodiments.
Figure 15:
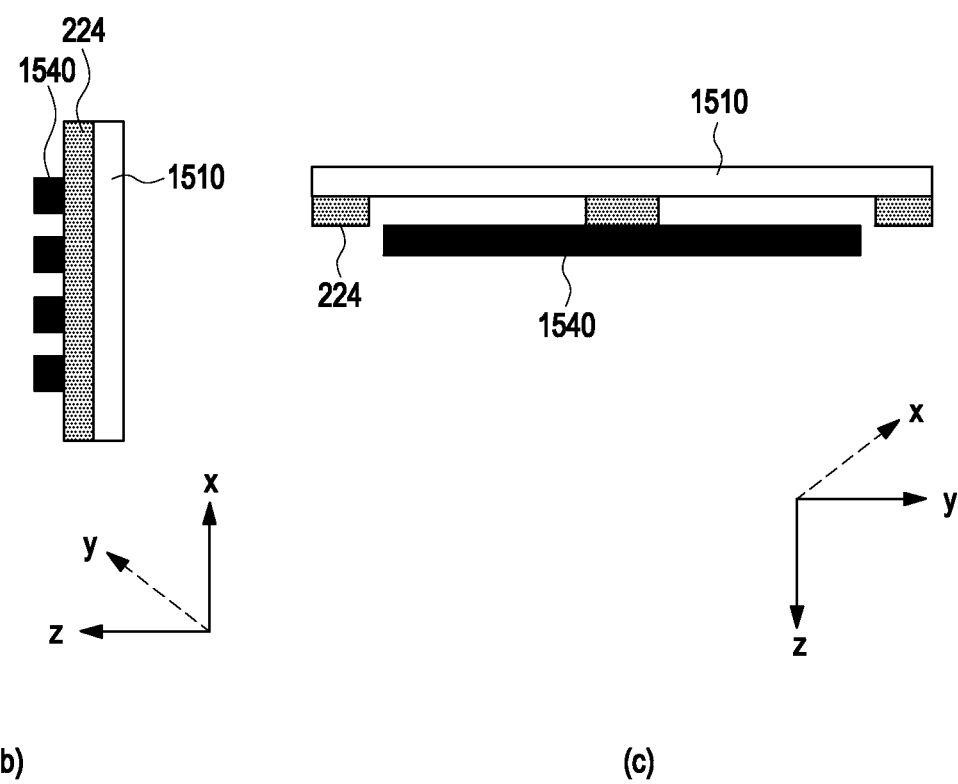

FIG. 15 is a diagram illustrating arrangement of a detection coil according to various embodiments. For example, FIG. 15 is a diagram illustrating a detection coil disposed on an asymmetrical conductive pattern (for example, a DD coil). For example, FIG. 15A shows disposition of a detection coil in x-y surface, FIG. 15B shows a cross-sectional view taken along E-E' of FIGS. 15A, and 15C shows a cross-sectional view taken along F-F' of FIG. 15A.

Referring to FIG. 15A to FIG. 15C, the detection coil 1510 (for example, the detection coil 100 in FIG. 1B) may include a first detection coil 1520 and a second detection coil 1530 including sub coils of different sizes, and the first detection coil 1520 and the second detection coil 1530 may be vertically stacked on each other with parallel movement or rotation.

According to an embodiment, the detection coil 1510 may be disposed to cover the conductive pattern 224. For example, the detection coil 1510 may be disposed to exceed the area of the conductive pattern 224 with reference to x-y surface. For example, based on that the conductive pattern 224 have an asymmetrical shape, the detection coil 1510 may have the same width and length.

According to an embodiment, each of the first detection coil 1520 and the second detection coil 1530 included in the detection coil 1510 may be disposed symmetrical with respect to the center of the conductive pattern 224.

According to an embodiment, the ferrite 1540, the conductive pattern 224, and the detection coil 1510 may be sequentially arranged.

As such, as the first detection coil and the second detection coil including unit coils of different sizes, the null lines of each detection coil do not overlap each other and thus the null area incapable of detecting a induced voltage fluctuation can be removed, and each detection is symmetric with respect to the center of the conductive pattern and thus the effect of the characteristics of the power transmitter or receiver and the arrangement environment can be reduced.

According to various embodiments, a detection coil may include a first sub coil disposed on at least one surface of a first PCB and including a first part and a second part having one end connected to one end of the first part, and wound in a direction opposite to a direction in which the first part is wound, and a second sub coil disposed on at least one surface of a second PCB other than the first PCB and including a third part and a fourth part having one end connected to one end of the third part and wound in a direction opposite to a direction in which the third part is wound, wherein, when viewed from one direction, the first part and the second part may have polygonal shapes symmetrical to each other, when viewed from one direction, the third part and the fourth part may have polygonal shapes symmetrical to each other, when viewed from another direction, the second part may be disposed under the first part, when viewed from the another direction, the fourth part may be disposed under the third part, and when viewed from the one direction, the first sub coil and the second sub coil may be arranged to partially overlap each other.

According to various embodiments, the first part may be disposed on an upper surface of the first PCB, the second part may be disposed on a lower surface of the first PCB, the third part may be disposed on an upper surface of the second PCB, and the fourth part may be disposed on a lower surface of the second PCB.

According to various embodiments, the first sub coil may include a first area in which the first part and the second part do not overlap when viewed from one direction, the second sub coil may include a second area in which the third part and the fourth part do not overlap when viewed from the one direction, and the first sub coil and the second sub coil may be arranged so that when viewed from the one direction, at least portions of the first area and the second area may not overlap each other.

According to various embodiments, the second sub coil may be disposed, when viewed from the one direction, to have a difference by a preconfigured angle with respect to the first sub coil.

According to various embodiments, the second sub coil may be disposed, when viewed from the one direction, to have a difference by a preconfigured distance with respect to the first sub coil in a direction perpendicular to or parallel with the one direction.

According to various embodiments, the first part has one of a triangular shape or an inverted triangular shape, and the second part has the other one of a triangular shape or an inverted triangular shape.

According to various embodiments, the first sub coil may be disposed so that a center of the first part and a center of the second part correspond to each other when viewed from the one direction, and the second sub coil may be disposed so that a center of the third part and a center of the fourth part correspond to each other when viewed from the one direction.

According to various embodiments, the detection coil may further include third sub coil disposed on at least one surface of the first PCB and having at least a portion overlapping the first sub coil, wherein the third sub coil may be disposed so that when viewed from the one direction, a fifth part wound in the same direction as the first part overlaps the first part, and a sixth part wound in the same direction as the second part overlaps the second part.

According to various embodiments, the third sub coil may be disposed so that when viewed from the one direction, the fifth part does not overlap the second part and the sixth part does not overlap the first part.

According to various embodiments, the fifth part may be disposed on a different surface from the first part among multiple surfaces of the first PCB, and the sixth part may be disposed on a different surface from the second part among the multiple surfaces of the first PCB.

According to various embodiments, the third sub coil may be connected to the first sub coil by the fifth part connected to the other end of the first part or the sixth part connected to the other end of the second part.

According to various embodiments, a detection coil may include a first part, when viewed from one direction, having a first polygonal shape and wound in a first winding direction, and a second part having one end connected to the first part, when viewed from the one direction, having a second polygonal shape different from the polygonal shape of the first part, and wound in a second winding direction opposite to the first winding direction, wherein, when viewed from another direction, the second part may be disposed below the first part, and the second polygonal shape, when viewed from the one direction, may have the same size as the first polygonal shape and may be symmetric to the first polygonal shape with reference to one axis.

According to various embodiments, the first polygonal shape may be one of a triangular shape or an inverted triangular shape, and the second polygonal shape may be the other one of a triangular shape or an inverted triangular shape.

According to various embodiments, when viewed from the one direction, a center of the first part and a center of the second part may correspond to each other.

According to various embodiments, the first part and the second part may be arranged so that when viewed from the one direction, at least portions thereof do not overlap each other.

According to various embodiments, the detection coil may further include a sub coil connected to the other end of the second part, wherein the sub coil may be disposed so that when viewed from the one direction, a third part wound in the same direction as the first part overlaps the first part, and a fourth part wound in the same direction as the second part overlaps the second part.

According to various embodiments, a wireless power transmitter may include a detection coil, a transmitting coil configured to supply wireless power to at least one wireless power receiver, and a control circuit, wherein the detection coil may include multiple sub coils, each of the multiple sub coils may include a first part, when viewed from one direction, having a first polygonal shape and wound in a first winding direction, and a second part having one end connected to one end of the first part, having a second polygonal shape different from the first polygonal shape, wound in a second winding direction opposite to the first winding direction, and when viewed from the other direction, disposed below the first part, when viewed from the one direction, the second polygonal shape may have the same size as the first polygonal shape and may be symmetric to the first polygonal shape with reference to one axis, and the control circuit may be configured to obtain, during the wireless power being transmitted to the outside, a value based on a first voltage value of a first channel corresponding to first sub coils connected to each other among the multiple sub coils and a second voltage value of a second channel corresponding to second sub coils connected to each other, and identify, based on the obtained value, presence of a foreign object.

According to various embodiments, the wireless power transmitter may further include a sensing circuit, wherein the sensing circuit may be configured to obtain the first voltage value and the second voltage value, and provide a value based on a ratio of the first voltage value and the second voltage value to the control circuit.

According to various embodiments, the control circuit may be configured to identify, based on a difference between the provided ratio-based value and a threshold value, presence of the foreign object.

According to various embodiments, the control circuit may be further configured to determine a correction value, based on at least one of presence of the at least one wireless power receiver, arrangement of the at least one wireless power receiver, or an operation mode of the wireless power receiver, and based on the determined correction value, control the sensing circuit to apply offset to the ratio.

According to various embodiments, the first part and the second part included in the first sub coil may have the same width and length, the third part and the fourth part included in the second sub coil may have the same width and length, and the first part and the third part may have different widths and lengths.

According to various embodiments, the second sub coil may be disposed, when viewed from the one direction, to have no difference in angle with respect to the first sub coil.

According to various embodiments, the second sub coil may be disposed, when viewed from the one direction, to have no difference in distance with respect to the first sub coil in a direction perpendicular to or parallel with the one direction.

It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled/connected with/to the other element directly (e.g., wiredly), wirelessly, or via a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., the program 140) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute the one or more stored instructions. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities, and some of the multiple entities may be separately disposed in any other element. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

Although the present disclosure has been described with various embodiments, various changes and modifications may be suggested to one skilled in the art. It is intended that the present disclosure encompass such changes and modifications as fall within the scope of the appended claims.

What is claimed is:
1. A detection coil comprising:
a first sub coil disposed on at least one surface of a first printed circuit board (PCB) and comprising a first part and a second part, wherein the second part includes one end connected to one end of the first part and is wound in a direction opposite to a direction in which the first part is wound; and
a second sub coil disposed on at least one surface of a second PCB and comprising a third part and a fourth part, wherein the fourth part includes one end con- nected to one end of the third part, and is wound in a direction opposite to a direction in which the third part is wound, wherein the first part and the second part are polygonal shapes symmetrical to each other when viewed from a first direction, wherein the third part and the fourth part are polygonal shapes symmetrical to each other when viewed from the first direction, wherein the second part is disposed under the first part when viewed from a second direction different from the first direction, wherein the fourth part is disposed under the third part when viewed from the second direction, and wherein the first sub coil and the second sub coil are arranged to partially overlap each other when viewed from the first direction.

2. The detection coil of claim 1, wherein:
the first part is disposed on an upper surface of the first PCB;
the second part is disposed on a lower surface of the first PCB;
the third part is disposed on an upper surface of the second PCB; and
the fourth part is disposed on a lower surface of the second PCB.

3. The detection coil of claim 1, wherein:
the first sub coil comprises a first area in which the first part and the second part overlap each other when viewed from the first direction;
the second sub coil comprises a second area in which the third part and the fourth part overlap when viewed from the first direction; and
the first sub coil and the second sub coil are arranged to at least partially not overlap each other when viewed from the first direction.

4. The detection coil of claim 1, wherein the second sub coil is disposed to differ by a preconfigured angle with respect to the first sub coil when viewed from the first direction.

5. The detection coil of claim 1, wherein the second sub coil is disposed to, when viewed from the first direction, differ by a preconfigured distance with respect to the first sub coil in a direction perpendicular to or parallel with the first direction.

6. The detection coil of claim 1, wherein:
the first part has a triangular shape or an inverted triangular shape; and
the second part has the other of the triangular shape or the inverted triangular shape.

7. The detection coil of claim 1, wherein:
the first sub coil is disposed such that a center of the first part and a center of the second part correspond to each other when viewed from the first direction; and
the second sub coil is disposed such that a center of the third part and a center of the fourth part correspond to each other when viewed from the first direction.

8. The detection coil of claim 1, further comprising a third sub coil disposed on at least one surface of the first PCB and at least partially overlapping the first sub coil,
wherein the third sub coil is disposed so that when viewed from the first direction, a fifth part that is wound in the same direction as the first part overlaps the first part, and a sixth part that is wound in the same direction as the second part overlaps the second part.

9. The detection coil of claim 8, wherein the third sub coil is disposed so that when viewed from the first direction, the fifth part does not overlap the second part and the sixth part does not overlap the first part.

10. The detection coil of claim 8, wherein:
the fifth part is disposed on a different surface from the first part among multiple surfaces of the first PCB; and
the sixth part is disposed on a different surface from a surface where the second part is disposed among the multiple surfaces of the first PCB.

11. The detection coil of claim 8, wherein the third sub coil is connected to the first sub coil by the fifth part that is connected to the other end of the first part or by the sixth part that is connected to another end of the second part.

12. The detection coil of claim 1, wherein the first part and the second part included in the first sub coil have a same width and a same length,
the third part and the fourth part included in the second sub coil have a same width and a same length, and
the first part and the third part have different widths and lengths.

13. The detection coil of claim 12, wherein the second sub coil is disposed to have a same angle with respect to the first sub coil when viewed from the first direction.

14. The detection coil of claim 12, wherein the second sub coil is disposed to have no difference in distance with respect to the first sub coil in a direction perpendicular to or parallel with the first direction when viewed from the first direction.

15. A detection coil comprising:
a first part formed in a first polygonal shape and wound in a first winding direction when viewed from a first direction; and
a second part including one end connected to one end of the first part, and formed in a second polygonal shape different from the first polygonal shape,
wherein the second part is wound in a second winding direction opposite to the first winding direction when viewed from the first direction, and is disposed below the first part when viewed from a second direction, and
wherein the second polygonal shape has a same size as the first polygonal shape and is symmetric to the first polygonal shape with reference to one axis when viewed from the first direction.

16. The detection coil of claim 15, wherein the first polygonal shape is a triangular shape or an inverted triangular shape, and
the second polygonal shape is the other one of the triangular shape or the inverted triangular shape.

17. The detection coil of claim 15, wherein when viewed from the first direction, a center of the first part and a center of the second part correspond to each other.

18. The detection coil of claim 15, wherein when viewed from the first direction, the first part and the second part are arranged to at least partially not overlap each other.

19. The detection coil of claim 15, further comprising a sub coil connected to another end of the second part,
wherein the sub coil is disposed such that when viewed from the first direction, a third part that is wound in the same direction as the first part overlaps the first part, and a fourth part that is wound in the same direction as the second part overlaps the second part.

20. A wireless power transmitter comprising:
a detection coil that comprises multiple sub coils, wherein each of the multiple sub coils comprises:
a first part that, when viewed from a first direction, includes a first polygonal shape and is wound in a first winding direction; and
a second part that includes one end connected to one end of the first part, a second polygonal shape different from the first polygonal shape, and that is wound in a second winding direction opposite to the first winding direction, and that is, disposed below the first part when viewed from another direction, and
wherein the second polygonal shape has a same size as the first polygonal shape and is symmetric to the first polygonal shape with reference to one axis when viewed from the first direction;
a transmitting coil configured to supply wireless power to at least one wireless power receiver; and
a control circuit configured to:
  obtain, while the wireless power is being transmitted to an outside, a value based on a first voltage value of a first channel corresponding to first sub coils connected to each other among the multiple sub coils and a second voltage value of a second channel corresponding to second sub coils connected to each other; and
  identify, based on the obtained value, presence of a foreign object.

21. The wireless power transmitter of claim 20, further comprising a sensing circuit configured to:
  obtain the first voltage value and the second voltage value; and
  provide a ratio-based value based on a ratio of the first voltage value and the second voltage value to the control circuit.

22. The wireless power transmitter of claim 21, wherein the control circuit is configured to identify, based on a difference between the provided ratio-based value and a threshold value, the presence of the foreign object.

23. The wireless power transmitter of claim 21, wherein the control circuit is further configured to:
  determine a correction value, based on at least one of presence of the at least one wireless power receiver, arrangement of the at least one wireless power receiver, or an operation mode of the wireless power receiver; and
  based on the determined correction value, control the sensing circuit to apply an offset to the ratio.

* * * * *